United States Patent
Kang et al.

(10) Patent No.: US 10,291,456 B2
(45) Date of Patent: May 14, 2019

(54) AUTOMATIC FREQUENCY CONTROLLERS FOR ADJUSTING DIGITAL LOOP FILTER GAIN BASED ON WIRELESS CHANNEL CLASSIFICATION, WIRELESS COMMUNICATION DEVICES INCLUDING THE SAME, AUTOMATIC FREQUENCY CONTROL METHODS AND WIRELESS COMMUNICATION METHODS

(71) Applicant: Samsung Electronics Co., Ltd., Suwon-si, Gyeonggi-do (KR)

(72) Inventors: Young-yun Kang, Hwaseong-si (KR); Min-ho Shin, Seongnam-si (KR); Hyun-ju Go, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/657,598

(22) Filed: Jul. 24, 2017

(65) Prior Publication Data

US 2018/0183643 A1 Jun. 28, 2018

(30) Foreign Application Priority Data

Dec. 23, 2016 (KR) .................. 10-2016-0177947

(51) Int. Cl.
*H04L 27/26* (2006.01)
*H04B 7/01* (2006.01)
(Continued)

(52) U.S. Cl.
CPC ............. *H04L 27/266* (2013.01); *H03J 7/02* (2013.01); *H03L 7/08* (2013.01); *H03L 7/093* (2013.01);
(Continued)

(58) Field of Classification Search
CPC ......... H04L 27/2657; H04L 2027/0067; H04L 2027/0069; H04L 2027/0065;
(Continued)

(56) References Cited

U.S. PATENT DOCUMENTS 6,081,563 A 6/2000 Taga et al.
7,099,639 B2 8/2006 Akahori
(Continued)

FOREIGN PATENT DOCUMENTS

JP 4563278 B2 10/2010
JP 4985535 B2 7/2012
(Continued)

OTHER PUBLICATIONS

Young Yun Kang et al., "Support Vector Machine-Based Wireless Channel Classification for Adaptive AFC in LTE Downlink," Samsung Electronics, pp. 1-5, Sep. 26, 2006.

*Primary Examiner* — Emmanuel Bayard
(74) *Attorney, Agent, or Firm* — Harness, Dickey & Pierce, P.L.C.

(57) ABSTRACT

Automatic frequency controllers, automatic frequency control methods, wireless communication devices, and/or wireless communication methods are provided. The automatic frequency controllers for correcting a frequency offset between a base station and a terminal includes at least one processor communicatively coupled to a memory and configured to execute computer-readable instructions stored in the memory to obtain a phase estimate from a reference signal received from the base station; classify a downlink channel as a High Speed Train (HST) channel or a non-HST channel based on the phase estimate; adjust a loop gain according to the classified downlink channel; calculate a phase error based on the phase estimate and the loop gain; correct the frequency offset using the phase error; and
(Continued)

communicate with the base station after correcting the frequency offset.

27 Claims, 23 Drawing Sheets

(51) Int. Cl.
  *H03J 7/02*     (2006.01)
  *H03L 7/08*     (2006.01)
  *H03L 7/093*    (2006.01)
  *H04L 27/00*    (2006.01)
  *H04L 25/02*    (2006.01)

(52) U.S. Cl.
  CPC ............ *H04B 7/01* (2013.01); *H04L 25/0202* (2013.01); *H04L 27/0014* (2013.01); *H04L 2027/0026* (2013.01); *H04L 2027/0065* (2013.01); *H04L 2027/0067* (2013.01)

(58) Field of Classification Search
  CPC ..... H04L 2027/0046; H04L 2027/0053; H04L 2027/0063; H04L 2027/0071; H04L 2027/0081; H04L 27/2659; H04L 27/266; H04L 27/2662
  USPC .................................. 375/326–327, 344–345
  See application file for complete search history.

(56) References Cited

U.S. PATENT DOCUMENTS

| | | |
|---|---|---|
| 7,103,339 B2 | 9/2006 | Sternberg |
| 8,401,503 B2 | 3/2013 | Chung et al. |
| 2003/0232606 A1* | 12/2003 | Akahori ..................... H03J 7/04 455/123 |
| 2004/0057498 A1* | 3/2004 | Litwin, Jr. ............ H04B 1/7075 375/130 |
| 2005/0069055 A1* | 3/2005 | Song ....................... H04L 27/22 375/324 |
| 2005/0117681 A1* | 6/2005 | Lee .......................... H04L 7/033 375/376 |
| 2007/0200639 A1 | 8/2007 | Park et al. |
| 2010/0074384 A1* | 3/2010 | Hirayama ............... H03L 7/093 375/371 |
| 2010/0231195 A1* | 9/2010 | Higashino ........ G11B 20/10009 324/76.77 |
| 2010/0232488 A1 | 9/2010 | Song et al. |
| 2016/0173303 A1* | 6/2016 | Sai .......................... H04L 27/16 375/323 |

FOREIGN PATENT DOCUMENTS

| | | |
|---|---|---|
| JP | 5048104 B2 | 10/2012 |
| KR | 10-0363907 B1 | 12/2002 |
| KR | 10-0686071 B1 | 2/2007 |

* cited by examiner

AUTOMATIC FREQUENCY CONTROLLERS FOR ADJUSTING DIGITAL LOOP FILTER GAIN BASED ON WIRELESS CHANNEL CLASSIFICATION, WIRELESS COMMUNICATION DEVICES INCLUDING THE SAME, AUTOMATIC FREQUENCY CONTROL METHODS AND WIRELESS COMMUNICATION METHODS

CROSS-REFERENCE TO RELATED APPLICATION

This application claims the benefit of Korean Patent Application No. 10-2016-0177947, filed on Dec. 23, 2016, in the Korean Intellectual Property Office, the disclosure of which is incorporated herein in its entirety by reference.

BACKGROUND

Some example embodiments relate to wireless communication, and more particularly, to automatic frequency controllers for correcting a frequency offset between a base station and a terminal, automatic frequency control methods, wireless communication devices including an automatic frequency controller, and/or wireless communication methods.

In a wireless communication system, a terminal converts a radio frequency (RF) signal to a baseband signal by using a local oscillator, and since the local oscillator is independent from a base station, a carrier frequency offset may occur. In addition, when there is relative movement between the terminal and the base station, an additional frequency offset may occur due to the Doppler effect. In particular, in a high-speed train (HST) environment, when a terminal passes between fixed base stations at high speed, the Doppler shift may change quickly with time and thus reception performance may be degraded due to a frequency offset. In this case, an HST channel not only includes trains moving at high-speed but also similar high-speed environments in which elements move at high-speeds.

SUMMARY

According to some example embodiments, there is provided an automatic frequency controller of a terminal for correcting a frequency offset between a base station and the terminal, the automatic frequency controller includes: a memory having computer-readable instructions stored thereon; and at least one processor communicatively coupled to the memory and configured to execute the computer-readable instructions. The at least one processor is configured to obtain a phase estimate from a reference signal received from the base station. The at least one processor is further configured to classify a downlink channel as a High Speed Train (HST) channel or a non-HST channel based on the phase estimate. The at least one processor is further configured to adjust a loop gain according to the classified downlink channel. The at least one processor is further configured to calculate a phase error based on the phase estimate and the loop gain. The at least one processor is further configured to correct the frequency offset using the phase error. Furthermore the at least one processor is configured to communicate with the base station after correcting the frequency offset.

According to some example embodiments, there is an automatic frequency controller of a terminal for correcting a frequency offset between a base station and the terminal, the automatic frequency controller includes: a memory having computer-readable instructions stored thereon; and at least one processor communicatively coupled to the memory and configured to execute the computer-readable instructions. The at least one processor is configured to classify a downlink channel as a High Speed Train (HST) channel or a non-HST channel based on a reference signal received from the base station, the reference signal including the frequency offset. The at least one processor is further configured to determine a loop gain as a variable loop gain when the downlink channel is classified as the HST channel. The at least one processor is further configured to determine the loop gain as a fixed loop gain when the downlink channel is classified as the non-HST channel. The at least one processor is further configured to adjust the loop gain based on determining the loop gain as a variable loop gain. The at least one processor is further configured to calculate a value corresponding to the frequency offset from the reference signal according to one of the variable loop gain or the fixed loop gain. The at least one processor is further configured to correct the frequency offset using the value. Furthermore, the at least one processor is configured to communicate with the base station after correcting the frequency offset.

According to some example embodiments, there is an automatic frequency control method performed by a terminal, includes: obtaining a phase estimate from a reference signal received from a base station. The method further includes classifying a downlink channel as a High Speed Train (HST) channel or a non-HST channel based on the phase estimate. The method further includes determining a loop gain as a variable loop gain when the downlink channel is classified as the HST channel. The method further includes determining the loop gain as a fixed loop gain when the downlink channel is classified as the non-HST channel. The method further includes adjusting the loop gain based on determining the loop gain as a variable loop gain. The method further includes generating a phase error based on the phase estimate and at least one of the variable loop gain or fixed loop gain. The method further includes correcting a frequency offset with the base station, according to the phase error. Furthermore, the method includes communicating with the base station after correcting the frequency offset.

According to some example embodiments, there is provided a wireless communication device, including: a memory having computer-readable instructions stored thereon; and at least one processor communicatively coupled to the memory and configured to execute the computer-readable instructions. The at least one processor is configured to generate an oscillation signal having a local oscillation frequency. The at least one processor is further configured to generate a baseband signal based on an RF signal received from a base station and the oscillation signal. The at least one processor is further configured to classify a downlink channel as a High Speed Train (HST) channel or a non-HST channel based on a reference signal included in the baseband signal. The at least one processor is further configured to adjust a loop gain according to the classified downlink channel. The at least one processor is further configured to calculate a phase error from the reference signal according to the loop gain. The at least one processor is further configured to adjust the local oscillation frequency based on the calculated phase error. Furthermore, the at least one processor is configured to communicate with the base station using the adjusted local oscillation frequency.

According to some example embodiments, there is provided a wireless communication method performed by a terminal, includes: receiving a radio frequency (RF) signal from a base station. The method further includes generating an oscillation signal having a local oscillation frequency. The method further includes generating a baseband signal based on the RF signal and the oscillation signal. The method further includes classifying a downlink channel as a High Speed Train (HST) channel or a non-HST channel based on a reference signal included in the baseband signal. The method further includes determining a loop gain as a variable loop gain when the downlink channel is classified as the HST channel. The method further includes determining the loop gain as a fixed loop gain when the downlink channel is classified as the non-HST channel. The method further includes adjusting the loop gain based on determining the loop gain as a variable loop gain. The method further includes generating a phase error from the reference signal based on the loop gain; adjusting the local oscillation frequency based on the phase error. Furthermore, the method includes communicating with the base station using the adjusted local oscillation frequency.

According to some example embodiments, there is provided a wireless communication device, including: a memory having computer-readable instructions stored thereon; and at least one processor communicatively coupled to the memory and configured to execute the computer-readable instructions. The at least one processor is configured to receive an input signal having a carrier frequency and including a reference signal from a base station. The at least one processor is further configured to generate a first oscillation signal having a first oscillation frequency. The at least one processor is further configured to generate a baseband signal using the input signal and the first oscillation signal, the baseband signal including the reference signal. The at least one processor is further configured to generate at least one channel estimate based on the reference signal using the baseband signal; calculate differential correlation of the at least one channel estimate. The at least one processor is further configured to calculate a phase estimate based on the calculated differential correlation. The at least one processor is further configured to classify a channel corresponding to the base station as one of a High Speed Train (HST) channel or a non-HST channel based on the phase estimate. The at least one processor is further configured to determine a loop gain based on the classification of the channel; determine a phase error based on the phase estimate and the loop gain. The at least one processor is further configured to estimate a carrier frequency offset using the phase error. The at least one processor is further configured to generate a frequency control signal for matching the first oscillation frequency with the carrier frequency. The at least one processor is further configured to generate a second oscillation signal having a second oscillation frequency based on the frequency control signal. Furthermore, the at least one processor is configured to communicate with the base station using the second oscillation signal.

BRIEF DESCRIPTION OF THE DRAWINGS

Some example embodiments will be more clearly understood from the following detailed description taken in conjunction with the accompanying drawings in which.

DETAILED DESCRIPTION

Hereinafter, some example embodiments will be described in detail with reference to the accompanying drawings.

Figure 1:
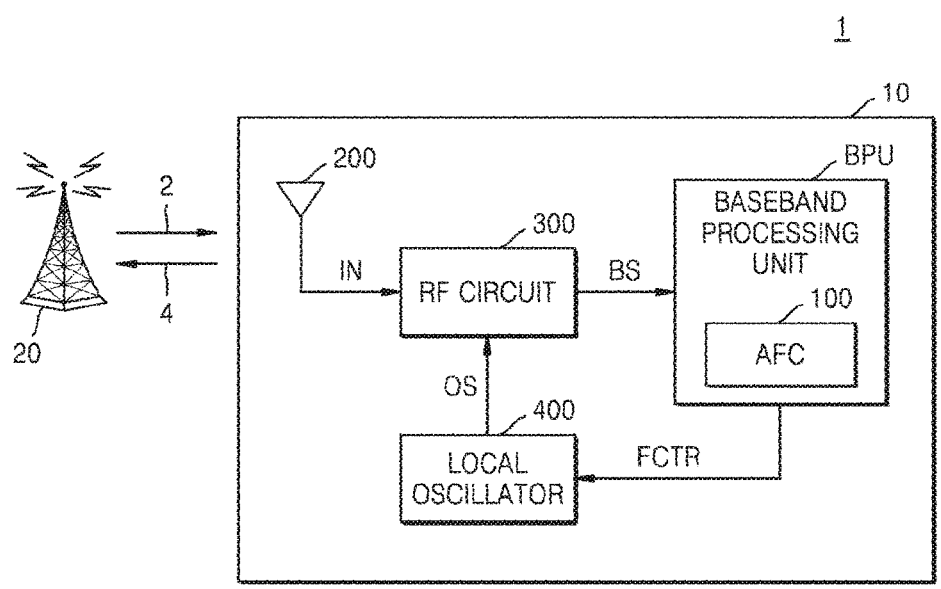
FIG. 1 is a block diagram of a wireless communication system according to an some example embodiments.

FIG. 1 is a block diagram of a wireless communication system 1 according to some example embodiments.

Referring to FIG. 1, the wireless communication system 1 may include a terminal 10 and a base station 20, and the terminal 10 and the base station 20 may communicate with each other through a downlink channel 2 and an uplink channel 4. The terminal 10 may include a baseband processing unit (BPU), an antenna 200, a radio frequency (RF) circuit 300, and a local oscillator 400. The BPU may include an automatic frequency controller (AFC) 100. Although not shown, the BPU may further include other components such as an analog-to-digital converter. Any or all of the components of the terminal 10 (e.g., the BPU, the antenna 200, the RF circuit 300, the local oscillator 400, and the AFC 100) may be a hardware block including an analog circuit and/or a digital circuit, and may be a software block including a plurality of instructions that are executed by a processor or the like. For example, the AFC 100 may be implemented in a modem chip. Operations described herein as being performed by any or all of the BPU, the antenna 200, the RF circuit 300, the local oscillator 400, and the AFC 100 may be performed by at least one processor executing program code that includes instructions stored in a memory corresponding to the operations. The term 'processor', as used in the example embodiments, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a microprocessor, a central processing unit (CPU), a processor core, a multi-core processor, a multiprocessor, an application-specific integrated circuit (ASIC), and a field programmable gate array (FPGA).

The terminal 10 may be a wireless communication device and may refer to various devices that may communicate with the base station 20 to transmit and receive data and/or control information. For example, the terminal 10 may be referred to as User Equipment (UE), a Mobile Station (MS), a Mobile Terminal (MT), a User Terminal (UT), a Subscriber Station (SS), a wireless device, a portable device, an Internet of Things device (IoT), or the like. The base station 20 may refer to a fixed station that communicates with the terminal 10 and/or another base station, and may communicate with the terminal 10 and/or the other base stations to transmit and receive data and/or control information. For example, the base station 20 may be referred to as a Node B, an evolved Node B (eNB), a Base Transceiver System (BTS), an Access Point (AP), or the like.

A wireless communication network between the terminal 10 and the base station 20 may support communication of multiple users by sharing available network resources. For example, in the wireless communication network, information may be transmitted in various ways such as Code Division Multiple Access (CDMA), Frequency Division Multiple Access (FDMA), Time Division Multiple Access (TDMA), Orthogonal Frequency Division Multiple Access (OFDMA), and Single Carrier Frequency Division Multiple Access (SC-FDMA).

The terminal 10 may receive a signal transmitted by the base station 20 through the downlink channel 2. Characteristics of the downlink channel 2 may change over time, due to the states of the terminal 10 and the base station 20 and/or surrounding conditions. For example, when the terminal 10 is in a high-speed train (HST) environment, Doppler shift variation with respect to time may be relatively large. In another example, when the terminal 10 is in a multipath fading environment, Doppler shift variation with respect time may be relatively small. Hereinafter, the components of the terminal 10 will be described in detail.

The RF circuit 300 may receive an input signal IN, transmitted by the base station 20, via the antenna 200 and may receive an oscillation signal OS from the local oscillator 400. The RF circuit 300 may output a baseband signal BS derived from the input signal IN and the oscillation signal OS. The input signal IN may be an RF signal having a high center frequency by a carrier wave, and the oscillation signal OS may have a local oscillation frequency corresponding to a carrier wave. For example, the RF circuit 300 may be implemented as an analog down-conversion mixer and may generate the baseband signal BS by down-converting the frequency of the input signal IN. In this case, when the local oscillation frequency does not match a carrier frequency of the input signal IN, a carrier frequency offset may occur. In particular, the carrier frequency offset may further increase in the HST environment.

The AFC 100 may correct a frequency offset between the base station 20 and the terminal 10. Specifically, the AFC 100 may receive the baseband signal BS and estimate the carrier frequency offset to generate a frequency control signal FCTR for matching the local oscillation frequency of the oscillation signal OS with the carrier frequency of the input signal IN.

In some example embodiments, the AFC 100 may classify the downlink channel 2 as an HST channel or a non-HST channel by using a reference signal included in the baseband signal BS, adjust a loop gain when the downlink channel 2 is an HST channel, and set the loop gain to a fixed value when the downlink channel 2 is a non-HST channel. A non-HST channel may refer to a wireless channel other than an HST channel. For example, a non-HST channel may refer to a multipath fading channel, but is not limited thereto.

A Long Term Evolution (LTE) standard defines a standard channel model based on various types of channel measurement data in order to simulate a channel environment experienced by a wireless terminal and utilize the simulated channel environment in the performance evaluation of a terminal. The standard channel model defined by the LTE standard may be divided into a multipath fading channel and an HST channel. The multipath fading channel and the HST channel will be described with reference to FIGS. 2 and 3 later.

The local oscillator 400 may generate an oscillation signal OS having a local oscillation frequency that varies according to the frequency control signal FCTR, and may provide the generated oscillation signal OS to the RF circuit 300. The terminal 10 may communicate with the base station 20 using the RF circuit 300 with the generated oscillation signal OS. In some example embodiments, the terminal 10 may further include a Phase Locked Loop (PLL) between the RF circuit 300 and the local oscillator 400 and may provide the frequency control signal FCTR to the PLL. In this case, the PLL may receive the oscillation signal OS from the local oscillator 400, and may generate a carrier wave signal from the oscillation signal OS according to the frequency control signal FCTR and provide the generated carrier wave signal to the RF circuit 300. The PLL may be a hardware block including an analog circuit and/or a digital circuit, and may be a software block including a plurality of instructions that are executed by a processor or the like. Operations described herein as being performed by the PLL may be performed by at least one processor executing program code that includes instructions stored in a memory corresponding to the operations.

Figure 2:
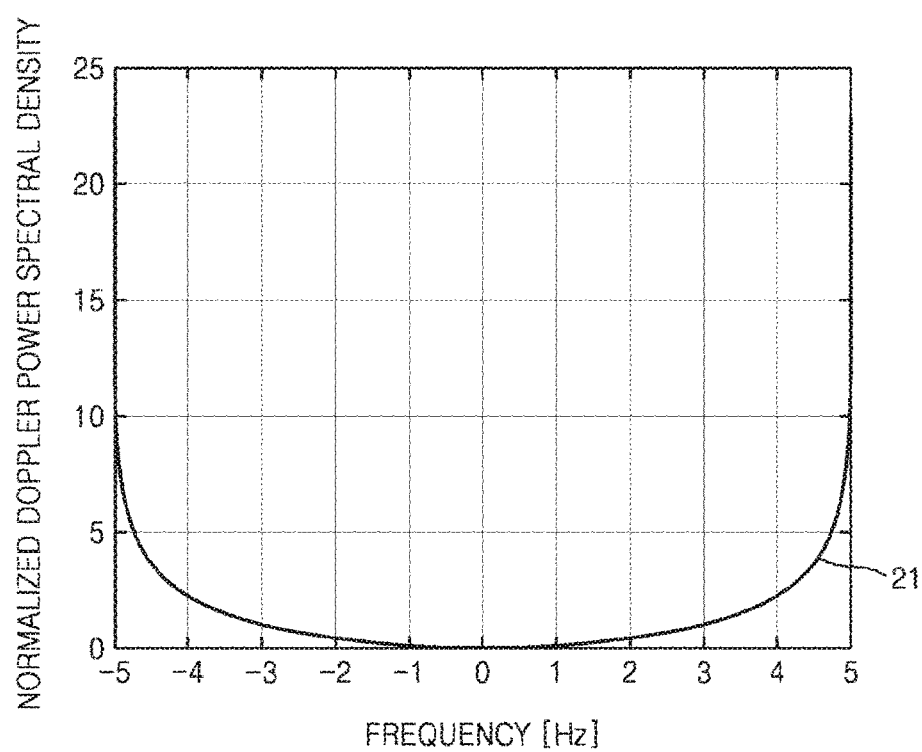
FIG. 2 is a graph showing a Doppler power spectrum according to frequency of a multipath fading channel.

FIG. 2 is a graph showing a Doppler power spectrum according to frequency of a multipath fading channel. Referring to FIG. 2, the horizontal axis represents the frequency and the vertical axis represents the Doppler power spectrum. Multipath fading channels may be defined as a combination of multipath delay profiles and may be classified into Extended Pedestrian A model (EPA), Extended Vehicular A model (EVA), and Extended Typical Urban model (ETU) according to delay spread. It is assumed that each delay tab has a Doppler power spectrum as shown in Equation 1 below.

$$S(f) = \begin{cases} \dfrac{1}{\pi f_{max}\sqrt{1-(f/f_{max})^2}}, & |f| \leq f_{max}, \\ 0, & \text{otherwise}. \end{cases} \quad \text{[Equation 1]}$$

Here, $f_{max}$ denotes an upper limit Doppler frequency, and in the LTE standard, 5, 70, and 300 Hz are defined as representative values of $f_{max}$. Curve 21 shows a Doppler power spectrum when $f_{max}$ is 5 Hz. A symmetrical form of the curve 21, that is, a U-shape, results from the assumption that the directions of received multipath signals are uniformly distributed in an interval [0, 2π). According to the technical idea of some example embodiments, an AFC may fix a loop gain in the case of a non-HST channel such as a multipath fading channel.

Figure 3:
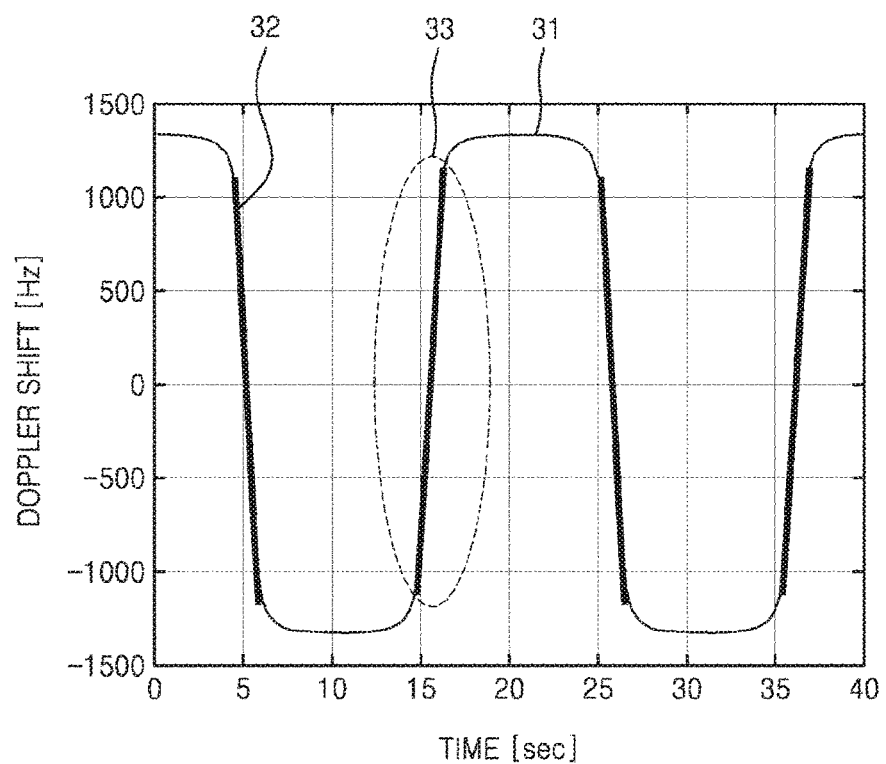
FIG. 3 is a graph showing a Doppler shift over time in a high-speed train (HST) environment.

FIG. 3 is a graph showing a Doppler shift with respect to time in an HST environment. Referring to FIG. 3, the horizontal axis represents the time and the vertical axis represents the Doppler shift. In the present specification, "HST environment" may be defined as a non-fading propagation channel environment with a given Doppler shift trajectory. In the HST environment, a Doppler shift 31 may be modelled as shown in Equation 2 below.

$$f_s(t) = f_{max} \cos \theta(t) \quad \text{[Equation 2]}$$

Here, $f_s$ denotes a Doppler shift, and $f_{max}$ denotes an upper limit Doppler frequency. $\cos \theta(t)$ is expressed by Equation 3 below.

$$\cos \theta(t) = \begin{cases} \dfrac{D_s/2 - vt}{\sqrt{D_{min}^2 + (D_s/2 - vt)^2}}, & 0 \leq t \leq D_s/v, \\ \dfrac{-1.5D_s + vt}{\sqrt{D_{min}^2 + (-1.5D_s + vt)^2}}, & D_s/v \leq t \leq 2D_s/v, \\ \cos \theta(t \bmod (2D_s/v)), & t > 2D_s/v. \end{cases} \quad \text{[Equation 3]}$$

Here, $D_s/2$ denotes an initial distance between the base station 20 and a train, $D_{min}$ denotes the shortest distance between the base station 20 and the train, v denotes the speed of the train, and t denotes time.

When the terminal 10 is in an HST environment, there is a section in which the Doppler shift is abruptly changed as in the case of a thick straight line 32 due to relative movement between the terminal 10 and the base station 20. A carrier frequency offset may increase due to the abrupt change of the Doppler shift, and the reception performance of the terminal 10 may be deteriorated. An area 33 indicated by a dotted line will be described with reference to FIG. 8 later.

In the present specification, "HST channel" may refer to a channel in which the amount of change in the Doppler shift over time in the HST environment is equal to or greater than a threshold value. For example, in a time interval corresponding to the thick straight line 32 in the HST environment, the downlink channel 2 may correspond to an HST channel. Therefore, even if the terminal 10 is in the HST environment, the downlink channel 2 may not always correspond to an HST channel. For example, in a time interval not corresponding to the thick straight line 32 in the HST environment, the downlink channel 2 may not correspond to an HST channel. According to the technical idea of some example embodiments, an AFC may adjust a loop gain in the case of an HST channel.

Figure 4:
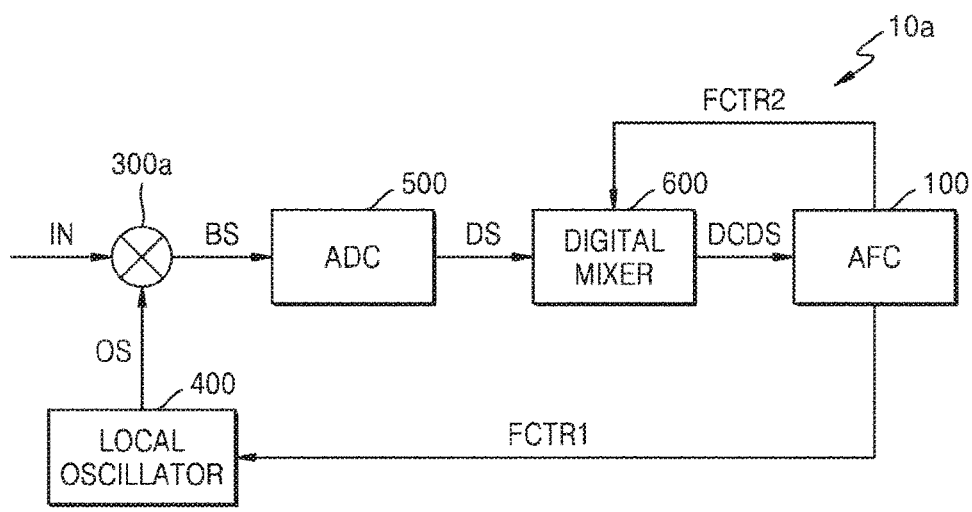
FIG. 4 is a block diagram illustrating components of wireless communication devices according to some example embodiments.

FIG. 4 is a block diagram illustrating components of wireless communication devices 10a according to some example embodiments. Referring to FIG. 4, a wireless communication device 10a may include an analog mixer 300a, a local oscillator 400, an analog-to-digital converter (hereinafter referred to as "ADC") 500, a digital mixer 600, and an AFC 100. The wireless communication device 10a may correspond to some example embodiments of the terminal 10 of FIG. 1, and repeated descriptions will be omitted. Any or all of the components of the wireless communication device 10a (e.g., the analog mixer 300a, the local oscillator 400, the ADC 500, the digital mixer 600, and the AFC 100) may be a hardware block including an analog circuit and/or a digital circuit, and may be a software block including a plurality of instructions that are executed by a processor or the like. For example, the AFC 100 may be implemented in a modem chip. Operations described herein as being performed by any or all of the analog mixer 300a, the local oscillator 400, the ADC 500, the digital mixer 600, and the AFC 100 may be performed by at least one processor executing program code that includes instructions stored in a memory corresponding to the operations.

The analog mixer 300a may receive the input signal IN and the oscillation signal OS and may generate a baseband signal BS by down-converting the frequency of the input signal IN by the local oscillation frequency of the oscillation signal OS. In some example embodiments, the analog mixer 300a may correspond to an implementation of the RF circuit 300 of FIG. 1. The local oscillator 400 may output the oscillation signal OS having a local oscillation frequency that varies according to a first frequency control signal FCTR1 received from the AFC 100. In some example embodiments, the local oscillation frequency is used by the wireless communication device 10a to communicate with a base station 20.

The ADC 500 may generate a digital signal DS by performing analog-to-digital conversion on the baseband signal BS. The digital mixer 600 may perform down-conversion on the digital signal DS according to a second frequency control signal FCTR2 received from the AFC 100, and accordingly, a carrier frequency offset may be compensated. The digital mixer 600 may provide a down-converted digital signal DCDS to the AFC 100.

In some example embodiments, the wireless communication device 10a may not include the digital mixer 600 and may include a pulse density modulation (PDM) block between the AFC 100 and the local oscillator 400. The PDM block may receive an output of the AFC 100, specifically an output of a loop filter (e.g., a digital loop filter 170 in FIG. 5) included in the AFC 100, and perform PDM, and may provide a digital signal generated as a result to the local oscillator 400. The PDM block may be a hardware block including an analog circuit and/or a digital circuit, and may be a software block including a plurality of instructions that are executed by a processor or the like. Operations described herein as being performed by the PDM block may be performed by at least one processor executing program code that includes instructions stored in a memory corresponding to the operations.

Figure 5:
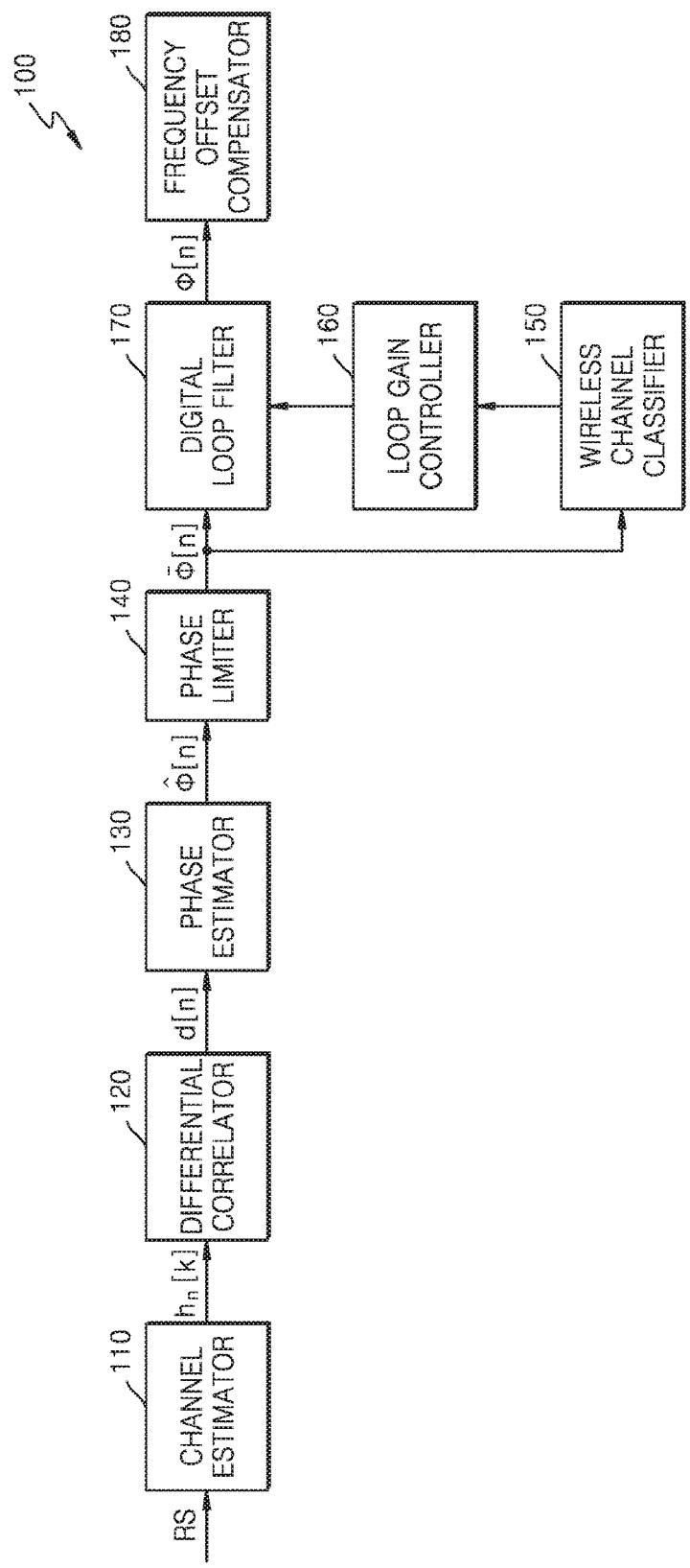
FIG. 5 is a block diagram illustrating components of automatic frequency controllers (AFCs), according to some example embodiments.

FIG. 5 is a block diagram illustrating components of an AFC (e.g., the AFC 100 of FIG. 1), according to some example embodiments. Referring to FIG. 5, the AFC 100 may include a channel estimator 110, a differential correlator 120, a phase estimator 130, a phase limiter 140, a wireless channel classifier 150, a loop gain controller 160, a digital loop filter 170, and a frequency offset compensator 180. In some example embodiments, the AFC 100 may not include the frequency offset compensator 180. Any or all of the components included in the AFC 100 (e.g., the channel estimator 110, the differential correlator 120, the phase estimator 130, the phase limiter 140, the wireless channel classifier 150, the loop gain controller 160, the digital loop filter 170, and the frequency offset compensator 180) may be a hardware block including an analog circuit and/or a digital circuit, or may be a software block including a plurality of instructions that are executed by a processor or the like. Operations described herein as being performed by any or all of the channel estimator 110, the differential correlator 120, the phase estimator 130, the phase limiter 140, the wireless channel classifier 150, the loop gain controller 160, the digital loop filter 170, and the frequency offset compensator 180 may be performed by at least one processor executing program code that includes instructions stored in a memory corresponding to the operations.

The channel estimator 110 may output channel estimates by performing channel estimation on a reference signal received from a base station (e.g., the base station 20 of FIG. 1). The reference signal may be included in the input signal IN received from the base station. For example, the reference signal may be referred to as pilot symbols or cell-specific reference signal (CRS) symbols. Hereinafter, reference symbols will be described in detail with reference to FIG. 6.

Figure 6:
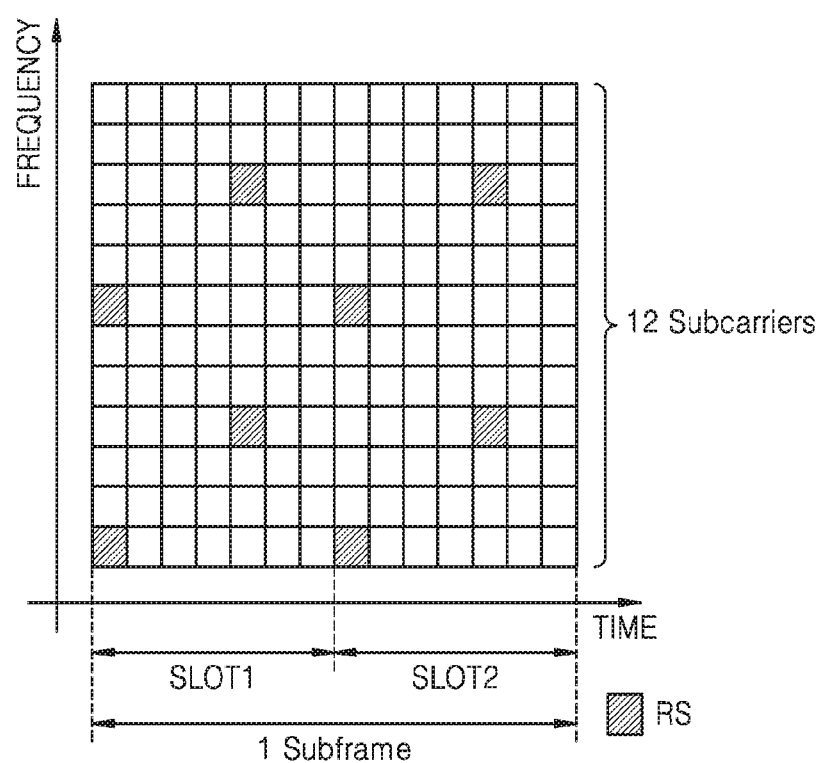
FIG. 6 shows reference symbols mapped to subframes according to some example embodiments.

FIG. 6 shows reference symbols RS mapped to subframes according to some example embodiments. Referring to FIG. 6, the horizontal axis represents time and the vertical axis represents frequency. For example, according to the LTE standard, a resource block includes 12 subcarriers in a frequency domain and 1 slot (0.5 ms) in a time domain, and two slots SLOT1 and SLOT2 constitutes one subframe (1 ms). A base station may transmit the reference symbols RS at defined time-frequency locations for each downlink subframe for channel estimation. Accordingly, a total of eight reference symbols RS may exist in one subframe.

Referring back to FIG. 5, the differential correlator 120 may output a differential correlation result by calculating a differential correlation for the channel estimates output from the channel estimator 110. Since a frequency offset has approximately the same effect on all subcarriers in the entire bandwidth, the differential correlator 120 may calculate differential correlation, as shown in Equation 4, by multiplying a channel estimate of the current time index by the complex conjugate of a channel estimate of a previous time index and accumulating the multiplication results.

$$d[n] = \sum_{k=1}^{L} h_n[k] h_m[k]^* \qquad \text{[Equation 4]}$$

Here, $h_n[k]$ denotes a channel estimate at a time index n and a subcarrier k, and L denotes the number of reference symbols RS in a frequency domain. m and n denote indices in a time domain, where m and n are not equal and it is assumed that there is no frequency variation over time between m and n.

The phase estimator 130 may calculate a phase estimate from a differential correlation result output from the differential correlator 120. The phase estimate may refer to an estimate of a phase difference. The phase difference may be proportional to an error between a carrier wave frequency and a local oscillation frequency. Specifically, the phase estimator 130 may calculate the phase estimate, as shown in Equation 5 below.

$$\hat{\phi}[n] = \angle d[n] \qquad \text{[Equation 5]}$$

Here, $\angle(\cdot)$ denotes the phase of a complex number. A calculation as shown in Equation 5 may be efficiently implemented by a coordinate rotation digital computer (CORDIC).

The phase limiter 140 may limit the phase estimate so that the magnitude of the phase estimate output from the phase estimator 130 is less than or equal to an upper limit phase estimate. Specifically, the output of the phase limiter 140 may be expressed by Equation 6 below.

$$\bar{\phi}[n] = \begin{cases} \phi_{th}, & \hat{\phi}[n] \geq \phi_{th}, \\ -\phi_{th}, & \hat{\phi}[n] \leq -\phi_{th}, \\ \hat{\phi}[n], & \text{otherwise.} \end{cases} \qquad \text{[Equation 6]}$$

Here, $\phi_{th}$ is the largest value of the phase estimate allowed in the digital loop filter 170 as the upper limit phase estimate. As described above, according to some example embodiments, as the AFC 100 includes the phase limiter 140, the AFC 100 may mitigate or prevent excessive phase estimation errors, thereby improving frequency error tracking performance in a low Signal to Interference plus Noise Ratio (SINR) environment.

The digital loop filter 170 may output a phase error corresponding to a frequency offset, based on a loop gain received from the loop gain controller 160 and an output of the phase limiter 140. In this case, the phase error may be a processed value from the phase estimate output from the phase estimator 130 and specifically, the phase error may be generated by filtering the phase estimate to remove noise in the phase estimate. In the present specification, the output of the digital loop filter 170 is referred to as a phase error or a phase offset in order to clearly distinguish between the output of the phase estimator 130 and the output of the digital loop filter 170. The digital loop filter 170 may output a phase error as shown in Equation 7 below.

$$\phi[n] = \alpha \bar{\phi}[n] + \beta \sum_{l=0}^{n} \bar{\phi}[l] \qquad \text{[Equation 7]}$$

Here, α denotes a proportional loop gain, and β denotes an integral loop gain. The proportional loop gain α determines how quickly to reflect an instantaneous phase estimate, e.g., the output $\bar{\phi}[n]$ of the phase limiter 140, to compensate for the frequency offset. Hereinafter, "loop gain" refers to the proportional loop gain, except when the proportional loop gain and the integral loop gain are clearly distinguished.

According to Equation 7, as the loop gain decreases, the instantaneous phase estimate, that is, the output of the phase limiter 140, is slightly reflected in the digital loop filter 170, and as a result the digital loop filter 170 slowly tracks channel variations. In this case, the digital loop filter 170 may output a stable phase error with a relatively small jitter, but may not track a fast frequency variation in an HST channel, and thus, performance deterioration may occur. On the other hand, as the loop gain α increases, the instantaneous phase estimate is reflected in the digital loop filter 170, and as a result the digital loop filter 170 rapidly tracks channel variations. In this case, the digital loop filter 170 may output an unstable phase error with a relatively large jitter, which may cause performance deterioration in a low SINR region. Hereinafter, the configuration of the digital loop filter 170 will be described in more detail with reference to FIG. 7.

Figure 7:
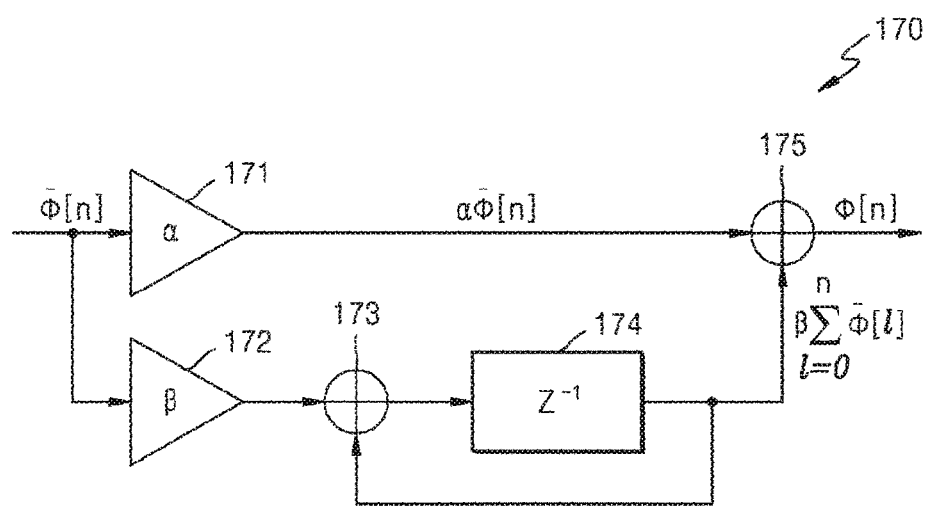
FIG. 7 is a block diagram illustrating components of a digital loop filter of FIG. 5, according to some example embodiments.

FIG. 7 is a block diagram illustrating components of the digital loop filter 170 of FIG. 5, according to some example embodiments. Referring to FIG. 7, the digital loop filter 170 may include first and second amplifiers 171 and 172, first and second adders 173 and 175, and a delay block 174. Any or all of the components of the digital loop filter 170 (e.g., the first amplifier 171, the second amplifier 172, the first adder 173, the second adder 175, and the delay block 174) may be a hardware block including an analog circuit and/or a digital circuit, and may be a software block including a plurality of instructions that are executed by a processor or the like. Operations described herein as being performed by any or all of the first amplifier 171, the second amplifier 172, the first adder 173, the second adder 175, and the delay block 174 may be performed by at least one processor executing program code that includes instructions stored in a memory corresponding to the operations.

The first amplifier 171 may output a value obtained by multiplying the output of the phase limiter 140 by a proportional loop gain α, and the second amplifier 172 may output a value obtained by multiplying the output of the phase limiter 140 by an integral loop gain β. The output of the second amplifier 172 may be integrated by using the first adder 173 and the delay block 174. The second adder 175 may output a phase error by adding the output of the first amplifier 171 and the output of the delay block 174.

Referring back to FIG. 5, the wireless channel classifier 150 may classify the downlink channel 2 as an HST channel or a non-HST channel. In some example embodiments, the wireless channel classifier 150 may classify the downlink channel 2 as an HST channel or a non-HST channel, based on the statistical characteristics of a phase estimate in the HST channel and the non-HST channel. This will be described in detail with reference to FIGS. 10A to 13. In some example embodiments, the wireless channel classifier 150 may classify the downlink channel 2 as an HST channel or a non-HST channel, based on training data obtained in an HST channel environment and a non-HST channel environment. This will be described in detail with reference to FIGS. 14 to 18B.

The loop gain controller 160 may determine whether to change the loop gain according to the output of the wireless channel classifier 150. In some example embodiments, the loop gain controller 160 may control the proportional loop gain, but some example embodiments are not limited thereto. In some example embodiments, the loop gain controller 160 may control the proportional loop gain and/or the integral loop gain. Specifically, the loop gain controller 160 may output a variable loop gain by adjusting the loop gain when the downlink channel 2 is an HST channel. On the other hand, the loop gain controller 160 may determine the loop gain as a fixed loop gain when the downlink channel 2 is a non-HST channel. The loop gain controller 160 may determine the loop gain as shown in Equation 8 below.

$$\alpha = 2^{-K} \quad \text{[Equation 8]}$$

Here, α is a loop gain and K is a loop gain index. For example, the loop gain controller 160 may increase the loop gain α by decreasing the loop gain index K when the downlink channel 2 enters an HST channel. For example, the loop gain controller 160 may reduce the loop gain α by increasing the loop gain index K when the downlink channel 2 escapes from an HST channel.

In addition, the loop gain controller 160 may determine the loop gain α as a lower limit loop gain when the loop gain α is less than low loop gain threshold, and may determine the loop gain α as an upper limit loop gain when the loop gain α is greater than high loop gain threshold. In some example embodiments, the lower limit loop gain may be equal to the low loop gain threshold. In some example embodiments, the upper limit loop gain may be equal to the high loop gain threshold. Hereinafter, the output of the digital loop filter 170 according to the loop gain α will be described in detail with reference to FIG. 8.

The digital loop filter 170 may output a phase error corresponding to a frequency offset, based on the loop gain received from the loop gain controller 160 and the output of the phase limiter 140. The frequency offset compensator 180 may estimate the frequency offset according to the phase error and generate a frequency control signal for controlling a local oscillation frequency according to an estimated frequency offset. In some example embodiments, the frequency offset compensator 180 may be implemented as a PDM block. In some example embodiments, the local oscillation frequency is used by a wireless communication device (e.g., wireless communication device 10a) to communicate with a base station (e.g., base station 20).

Figure 8:
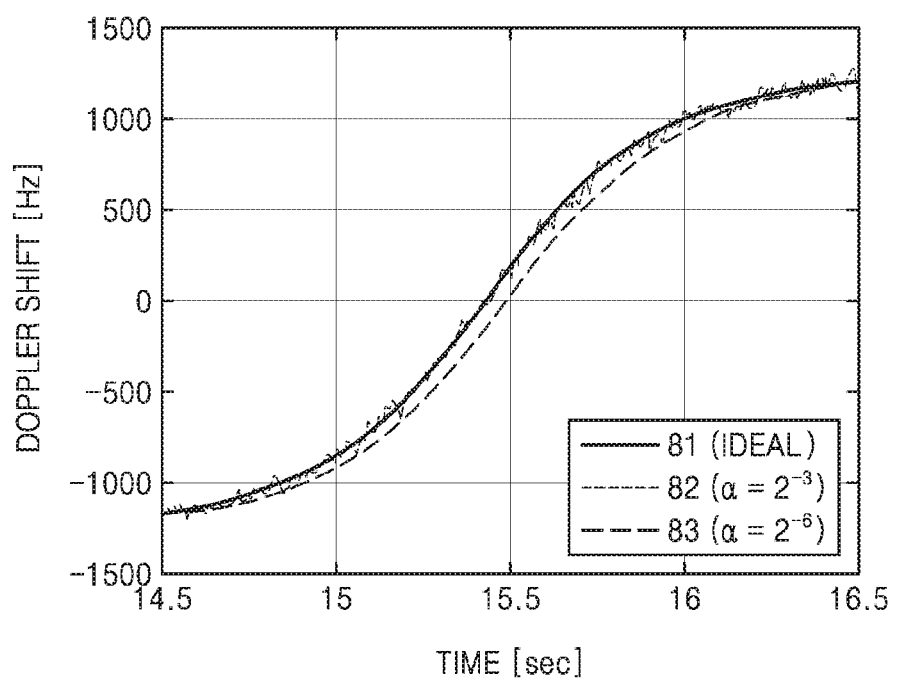
FIG. 8 is a graph showing Doppler shift estimates according to different loop gains, according to some example embodiments.

FIG. 8 is a graph showing Doppler shift estimates according to different loop gains, according to some example embodiments. The graph illustrated in FIG. 8 is a simulation result for the Doppler shift estimates in an HST channel when an SINR is 0 dB. For example, the Doppler shift estimates shown in FIG. 8 may correspond to an example of a dotted area 33 in FIG. 3. Hereinafter, description will be made with reference to FIG. 5 and FIG. 8 together.

Referring to FIG. 8, the horizontal axis represents time and the vertical axis represents Doppler shift. A curve 81 represents an ideal Doppler shift estimate, a curve 82 represents a Doppler shift estimate when a loop gain is relatively large (e.g., α=2⁻³), and a curve 83 represents a Doppler shift estimate when the loop gain is relatively small (e.g., α=2⁻⁶). The relationship between a relative speed of a terminal and a base station and a frequency offset is expressed by Equation 9 below.

$$\Delta f = \frac{\Delta V}{c} f_0 \quad \text{[Equation 9]}$$

Here, $\Delta f$ is a frequency offset, $\Delta V$ is a relative speed variation, c is the speed of light, and $f_0$ is a center frequency (e.g., a local oscillation frequency). The relationship between the frequency offset and a phase error is shown in Equation 10 below.

$$\phi[n] \propto 2\pi \Delta f \quad \text{[Equation 10]}$$

In this manner, since the phase error is proportional to the frequency offset, the frequency offset may be accurately estimated through the phase error. Thus, the Doppler shift estimate may be obtained from the phase error output from the digital loop filter 170, and the behavior of the Doppler shift estimate may be similar to or the same as that of the phase error. In this case, the delay by which the phase error is reflected in a frequency offset correction may be determined by the loop gain.

According to some example embodiments, the loop gain controller 160 may adjust the loop gain when the downlink channel 2 is an HST channel. When the loop gain increases, a locking time may decrease by quickly tracking a change in Doppler shift, while jitter may increase, as in the curve 82. When the loop gain decreases, jitter may decrease, while a locking time may increase by not quickly tracking a change in a Doppler shift, as in the curve 83. Therefore, the loop gain controller 160 may appropriately change the loop gain according to a channel state in consideration of a performance trade-off relationship by the loop gain.

Figure 9:
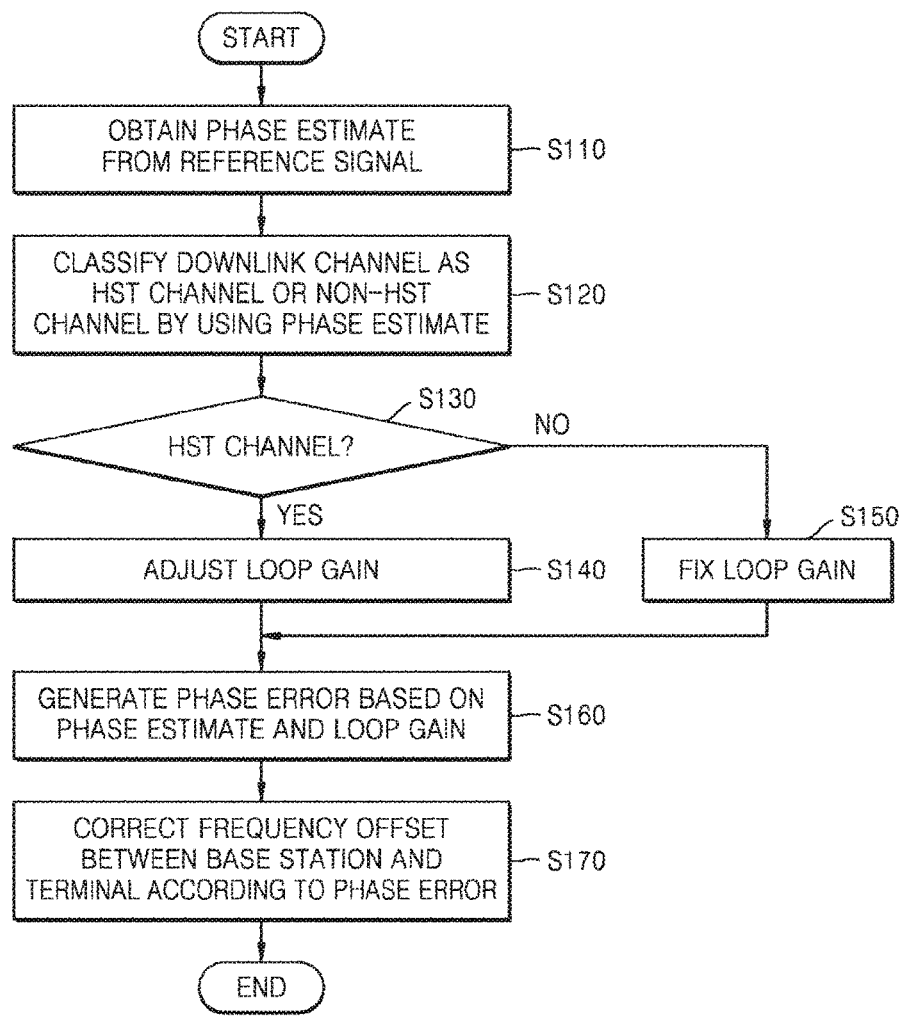
FIG. 9 is a flowchart illustrating automatic frequency control methods according to some example embodiments.

FIG. 9 is a flowchart illustrating automatic frequency control methods according to some example embodiments. Hereinafter, the automatic frequency control methods will be described with reference to FIG. 5 and FIG. 9. The automatic frequency control methods according to some example embodiments are methods for compensating a frequency offset between a base station and a terminal. For example, the automatic frequency control methods may include operations that are performed in a time-series manner in the automatic frequency controller 100 of FIG. 5. The description provided above with reference to FIG. 5 may also be applied to some example embodiments, and a redundant description will be omitted.

In Operation S110, a phase estimate is obtained from a reference signal. The phase estimate may refer to an estimate of a phase shift and may be obtained from a differential correlation result for channel estimates obtained from a plurality of reference symbols included in the reference signal. In some example embodiments, the phase estimate may be limited such that the obtained phase estimate is less than or equal to an upper limit phase estimate.

In Operation S120, a downlink channel is classified as an HST channel or a non-HST channel by using the phase estimate. In some example embodiments, the downlink channel may be classified as an HST channel or a non-HST channel based on at least one of a moving mean and a moving variance of the absolute value of the phase estimate. In some example embodiments, the downlink channel may be classified as an HST channel or a non-HST channel based on at least one of the absolute value of the phase estimate and the absolute value of a phase estimate difference.

In Operation S130, it is determined whether the downlink channel is an HST channel. If it is determined that the downlink channel is an HST channel, Operation S140 is performed. If it is determined that the downlink channel is not an HST channel, Operation S150 is performed. In Operation S140, a loop gain is adjusted. In this case, if the adjusted loop gain is less than a low loop gain threshold, the loop gain may be determined to be lower limit loop gain, and if the adjusted loop gain is greater than a high loop gain threshold, the loop gain may be determined to be an upper limit loop gain. In some example embodiments, the lower limit loop gain may be equal to the low loop gain threshold. In some example embodiments, the upper limit loop gain may be equal to the high loop gain threshold. In Operation S150, the loop gain is fixed.

In Operation S160, a phase error is generated based on the phase estimate and the loop gain. Specifically, the phase error may be generated by multiplying the phase estimate by the loop gain. In Operation S170, a frequency offset between a base station and a terminal is corrected according to the phase error. Specifically, the frequency offset may be estimated according to the phase error, and a local oscillation frequency may be changed by generating a frequency control signal according to the estimated frequency offset. In some example embodiments, the terminal may communicate with the base station using the changed local oscillation frequency.

Hereinafter, with reference to FIGS. 10A to 13, a description will be given for some example embodiments in which a wireless channel is classified based on statistical characteristics of a phase estimate in the HST channel and the non-HST channel.

Figure 10A:
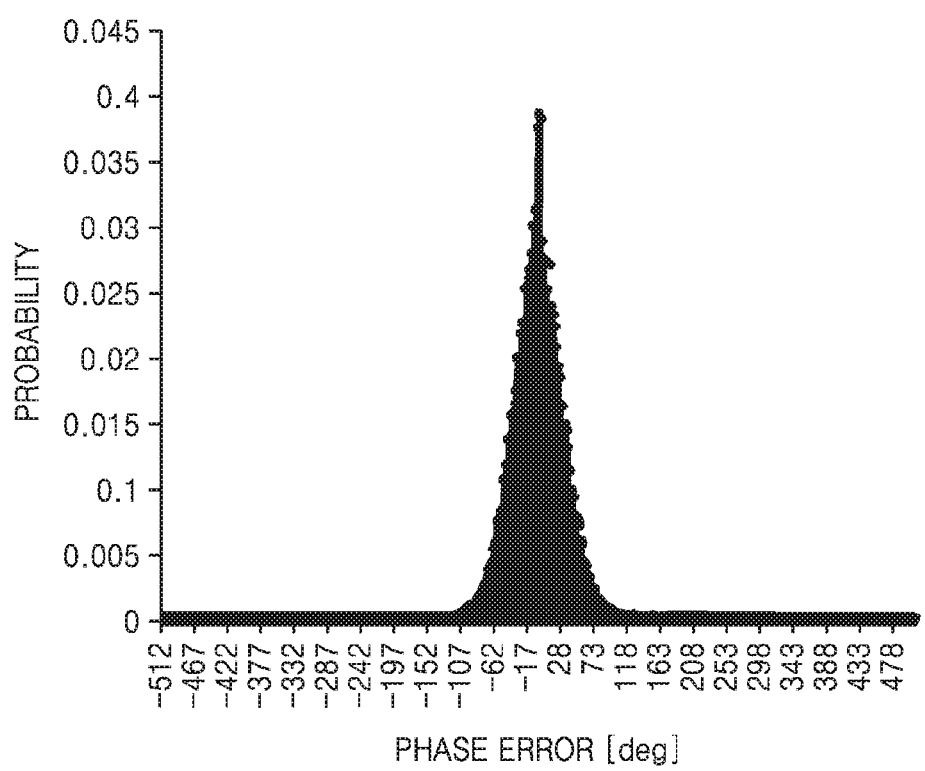
FIG. 10A shows the probability distribution of a phase estimate of an Extended Typical Urban model (ETU) 300 Hz channel.
Figure 10B:
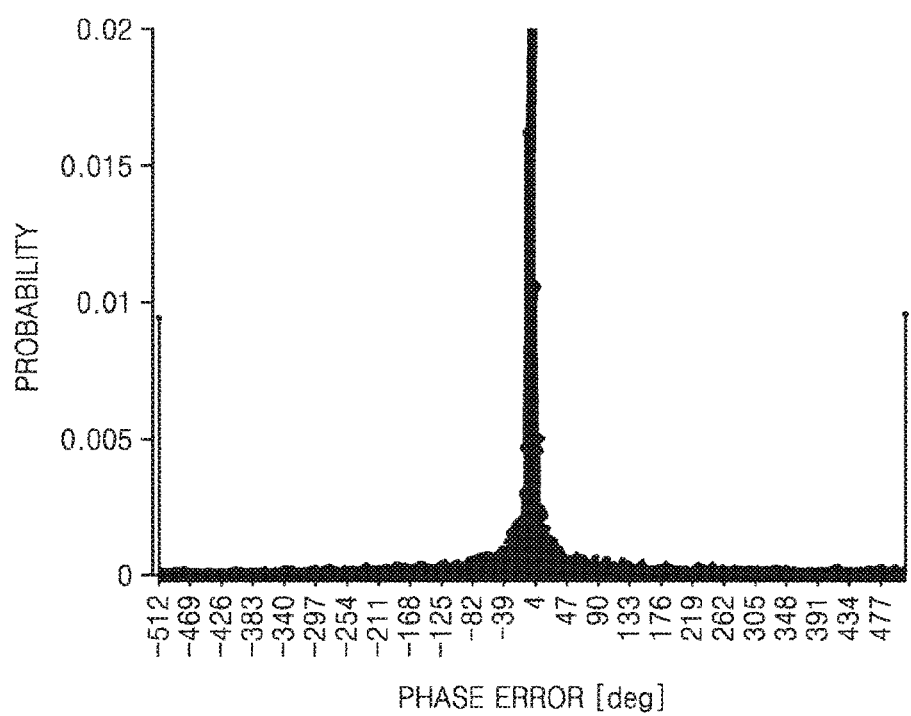
FIG. 10B shows the probability distribution of a phase estimate of an HST channel.

FIG. 10A shows the probability distribution of a phase estimate of an ETU 300 Hz channel, and FIG. 10B shows the probability distribution of a phase estimate of an HST channel. Referring to FIG. 10A, the horizontal axis represents phase estimate and the vertical axis represents probability. In a multipath fading channel, since a Doppler shift is uncorrelated with respect to time, an accumulated phase estimate due to the Doppler shift does not constantly increase in one direction, and thus an average of the accumulated phase estimates is close to zero. Thus, adaptive loop gain control may not be necessary since the accumulated phase estimate is relatively small in the multipath fading channel.

Referring to FIG. 10B, the horizontal axis represents phase estimate and the vertical axis represents probability. In an HST channel, since a Doppler shift increases continuously in one direction, an accumulated phase estimate may be relatively large. In particular, the greater the variation of the Doppler shift, the greater the probability that a phase estimate (e.g., 512 degrees or −512 degrees) away from the center will occur. Therefore, in order to rapidly track the Doppler shift in an HST channel, adaptive loop gain control may be desirable depending on a channel environment.

According to some example embodiments, a wireless channel classifier may determine a threshold value for determining whether a downlink channel is an HST channel, based on statistical characteristics of a phase estimate as shown in FIGS. 10A and 10B. Accordingly, the wireless channel classifier may calculate a moving mean and a moving variance for the absolute value of an actually input phase estimate and compare the calculated moving variance with the threshold value to determine whether the downlink channel is an HST channel. Hereinafter, a wireless channel classifier according to the some example embodiments will be described with reference to FIG. 11.

Figure 11:
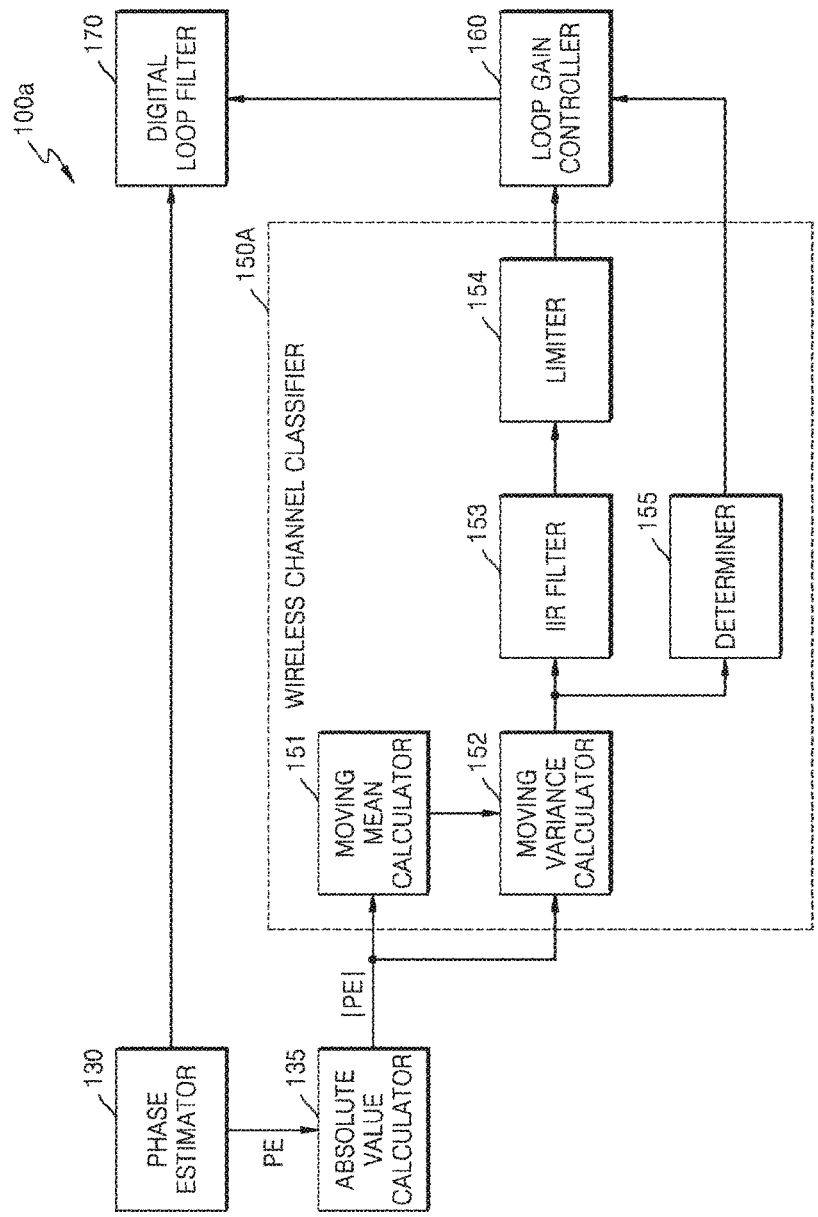
FIG. 11 is a block diagram illustrating an AFC including a wireless channel classifier using statistical characteristics of a phase estimate according to some example embodiments.

FIG. 11 is a block diagram illustrating automatic frequency controllers (AFC) 100a including a wireless channel classifier 150A using statistical characteristics of a phase estimate according to some example embodiments. Referring to FIG. 11, an AFC 100a may include a phase estimator 130, an absolute value calculator 135, a wireless channel classifier 150A, a loop gain controller 160 and a digital loop filter 170. In some example embodiments, the AFC 100a corresponds to the AFC 100 of FIG. 5, and thus a redundant description will be omitted. In some example embodiments, the AFC 100a may further include the channel estimator 110 and the differential correlator 120 of FIG. 5. In some example embodiments, the AFC 100a may further include the phase limiter 140 and/or the frequency offset compensator 180 of FIG. 5, but is not limited thereto. Any or all of the components of the AFC 100a (e.g., the phase estimator 130, the absolute value calculator 135, the wireless channel classifier 150A, the loop gain controller 160, the digital loop filter 170, the channel estimator 110, the differential correlator 120, the phase limiter 140, and the frequency offset compensator 180) may be a hardware block including an analog circuit and/or a digital circuit, and may be a software block including a plurality of instructions that are executed by a processor or the like. Operations described herein as being performed by any or all of the phase estimator 130, the absolute value calculator 135, the wireless channel classifier 150A, the loop gain controller 160, the digital loop filter 170, the channel estimator 110, the differential correlator 120, the phase limiter 140, and the frequency offset compensator 180 may be performed by at least one processor executing program code that includes instructions stored in a memory corresponding to the operations.

The phase estimator 130 may output a phase estimate PE and the absolute value calculator 135 may calculate the absolute value IPEI of the phase estimate. The wireless channel classifier 150A may classify a downlink channel (e.g., downlink channel 2) as an HST channel or a non-HST channel based on the absolute value IPEI of the phase estimate. The wireless channel classifier 150A may include a moving mean calculator 151 and a moving variance calculator 152. In addition, the wireless channel classifier 150A may further include an Infinite Impulse Response (IIR) filter 153 and a limiter 154. Further, the wireless channel classifier 150A may include a determiner 155. Any or all of the components of the wireless channel classifier 150A (e.g., the moving mean calculator 151, the moving variance calculator 152, the IIR filter 153, the limiter 154, and the determiner 155) may be a hardware block including an analog circuit and/or a digital circuit, and may be a software block including a plurality of instructions that are executed by a processor or the like. Operations described herein as being performed by any or all of the moving mean calculator 151, the moving variance calculator 152, the IIR filter 153, the limiter 154, and the determiner 155 may be performed by at least one processor executing program code that includes instructions stored in a memory corresponding to the operations. Hereinafter, operations of the components included in the wireless channel classifier 150A will be described in detail.

The moving mean calculator 151 may calculate a moving mean for the absolute value IPEI of the phase estimate. In some example embodiments, the moving mean calculator 151 may calculate an exponentially weighted moving mean of the absolute value IPEI of the phase estimate. Specifically, the moving mean calculator 151 may calculate a moving mean through Equations 11 to 13.

$$D[n]:=x[n]-\text{mean}[n-1] \quad \text{[Equation 11]}$$

Here, x[n] denotes a phase estimate in an n-th slot, mean[n−1] denotes a moving mean calculated in an n−1-th slot, D[n] denotes a difference between the phase estimate in the n-th slot and the moving mean calculated in the n−1-th slot.

$$i[n]:=\gamma * D[n] \quad \text{[Equation 12]}$$

Here, γ is a proportional constant that may be greater than 0 and less than 1 (e.g., 0<γ<1), and i[n] determines how much D[n] is reflected in a next moving mean. A moving mean in the n-th slot may be calculated as shown in Equation 13 below.

$$\text{mean}[n]:=\text{mean}[n-1]+i[n] \quad \text{[Equation 13]}$$

The moving variance calculator 152 may calculate a moving variance for the absolute value IPEI of the phase estimate. In some example embodiments, the moving variance calculator 152 may use data corresponding to the calculated moving mean to calculate the moving variance (as explained in further detail using Equation 14). In some example embodiments, the moving variance calculator 152 may calculate an exponentially weighted moving variance for the absolute value IPEI of the phase estimate. Specifically, the moving variance calculator 152 may calculate a moving variance, as shown in Equation 14.

$$\text{variance}[n]:=(1-\gamma)*(\text{variance}[n-1]+D[n]*i[n]) \quad \text{[Equation 14]}$$

In order to smooth a moving variance output from the moving variance calculator 152, the IIR filter 153 may perform IIR filtering on the moving variance. In some embodiments, the wireless channel classifier 150A may include any other filter in place of the IIR filter 153. The limiter 154 may limit the moving variance filtered by the IIR filter 153 to an upper limit variance value.

The determiner 155 may determine whether the downlink channel 2 is an HST channel or a non-HST channel by comparing the moving variance output from the moving variance calculator 152 with a threshold value, and may provide a determination result to the loop gain controller 160. In some example embodiments, the wireless channel classifier 150A may not include the determiner 155, and in this case, the loop gain controller 160 may determine whether to adjust a loop gain, based on a moving variance output from the limiter 154.

Figure 12:
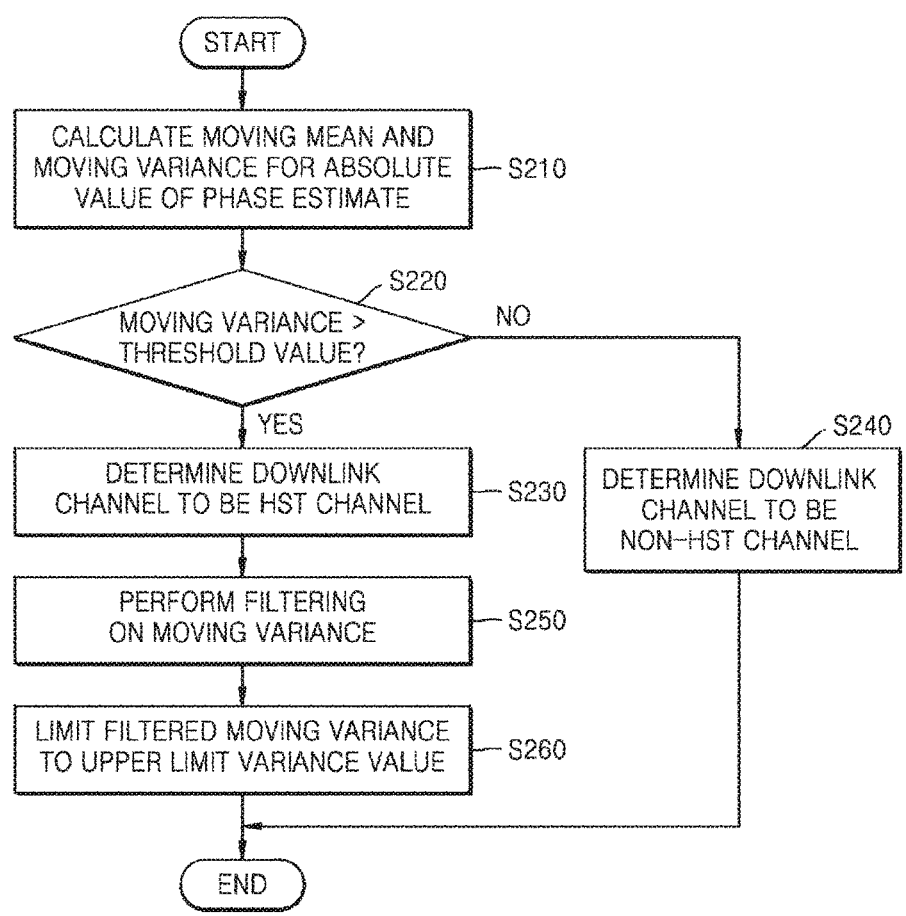
FIG. 12 is a flowchart illustrating wireless channel classification methods based on statistical characteristics of a phase estimate according to some example embodiments.

FIG. 12 is a flowchart illustrating wireless channel classification methods based on statistical characteristics of a phase estimate according to some example embodiments. Referring to FIG. 12, the wireless channel classification methods according to some example embodiments are methods of classifying wireless channels based on statistical characteristics of a phase estimate in HST and non-HST channels. For example, the wireless channel classification methods may include operations that are performed in a time-series manner in the wireless channel classifier 150A of FIG. 11. Therefore, the description provided above with reference to FIG. 11 may be applied to some example embodiments, and a redundant description will be omitted.

In Operation S210, a moving mean and a moving variance are calculated for the absolute value of a phase estimate. In Operation S220, it is determined whether the moving variance is greater than a threshold value. If it is determined that the moving variance is greater than the threshold value, Operation S230 is performed. Otherwise, Operation S240 is performed. In Operation S230, a downlink channel is determined to be an HST channel. In Operation S240, the downlink channel is determined to be a non-HST channel. In Operation S250, filtering is performed on the moving variance. In Operation S260, the filtered moving variance is limited to an upper limit variance value.

Figure 13:
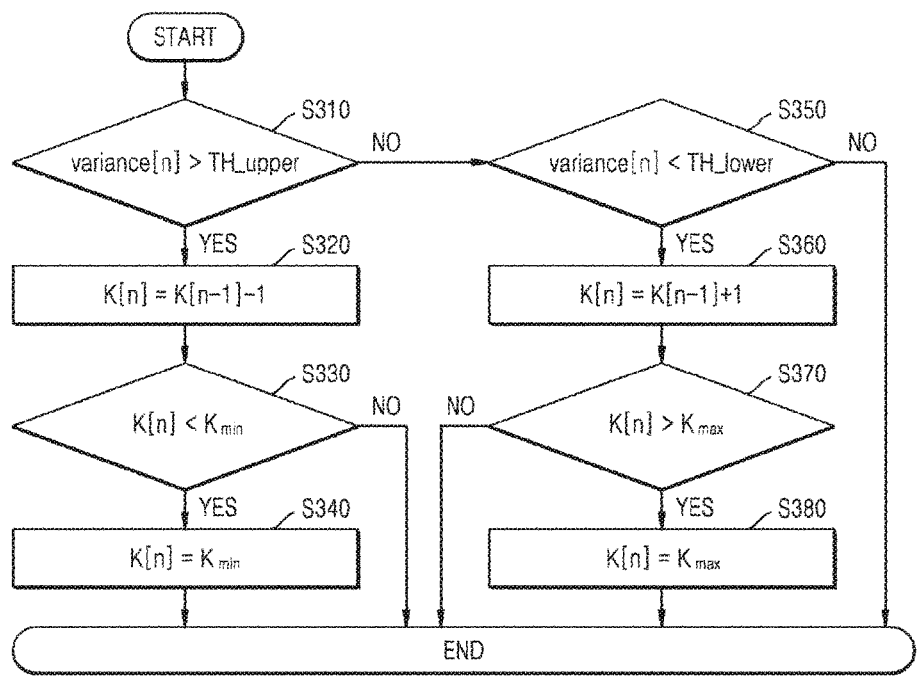
FIG. 13 is a flowchart illustrating loop gain control methods according to some example embodiments.

FIG. 13 is a flowchart illustrating loop gain control methods according to some example embodiments. Referring to FIG. 13, the loop gain control methods according to some example embodiments are methods of controlling a loop gain according to the type of a wireless channel. For example, the loop gain control methods may include operations that are performed in a time-series manner in the loop gain controller 160 of FIG. 11. The description provided above with reference to FIG. 11 may be applied to some example embodiments, and a redundant description will be omitted.

In Operation S310, it is determined whether the moving variance variance[n] is greater than an upper threshold TH_upper. A determination condition in Operation S310 may be referred to as an HST entry condition. As a result of the determination, if the moving variance variance[n] is greater than the upper threshold TH_upper, Operation S320 is performed. On the other hand, if the moving variance variance[n] is not greater than the upper threshold TH_upper, Operation S350 is performed.

In Operation S320, a loop gain index K[n] is adjusted by reducing the loop gain index K[n] from a previous loop gain index K[n−1]. As in Equation 8 above, a loop gain may be expressed by $\alpha=2^{-k}$, where a loop gain index is K. For example, in Operation S320, the loop gain index K[n] may be reduced by one from the previous loop gain index K[n−1], but some example embodiments are not limited thereto. In Operation S330, it is determined whether the loop gain index K[n] is less than a lower limit loop gain index $K_{min}$. As a result of the determination, if the loop gain index K[n] is less than the lower limit loop gain index $K_{min}$, Operation S340 is performed, and otherwise, the process of FIG. 13 ends. In Operation S340, the loop gain index K[n] is set to be equal to the lower limit loop gain index $K_{min}$.

In Operation S350, it is determined whether the moving variance variance[n] is less than a lower threshold TH_lower. A determination condition in Operation S350 may be referred to as an HST exit condition. As a result of the determination, if the moving variance variance[n] is less than the lower threshold TH_lower, Operation S360 is performed. On the other hand, if the moving variance variance[n] is not less than the lower threshold TH_lower, the process of FIG. 13 ends. As described above, if the moving variance variance[n] is equal to or greater than the lower threshold TH_lower and equal to or less than the upper threshold TH_upper, the downlink channel may be determined to be a non-HST channel and the loop gain index K[n] may not be changed.

In Operation S360, the loop gain index K[n] is increased from the previous loop gain index K[n−1]. For example, in Operation S360, the loop gain index K[n] may be increased by one from the previous loop gain index K[n−1], but some example embodiments are not limited thereto. In Operation S370, it is determined whether the loop gain index K[n] is greater than an upper limit loop gain index $K_{max}$. As a result of the determination, if the loop gain index K[n] is greater than the upper limit loop gain index $K_{max}$, Operation S380 is performed, and otherwise, the process of FIG. 13 ends. In Operation S380, the loop gain index K[n] is set to be equal to the upper limit loop gain index $K_{max}$.

Hereinafter, some example embodiments of classifying a wireless channel by machine learning methods based on training data obtained in an HST channel environment and a non-HST channel environment will be described with reference to FIGS. 14 to 18B.

Figure 14:
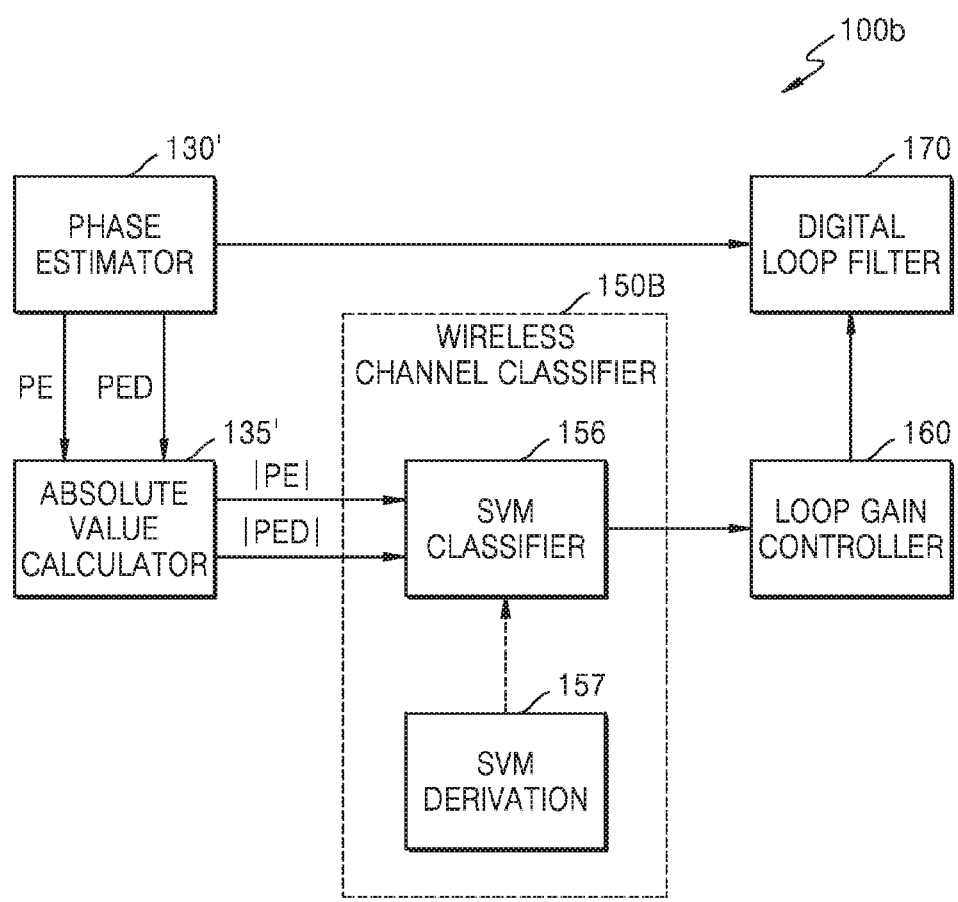
FIG. 14 is a block diagram illustrating an AFC including a wireless channel classifier using machine learning methods based on training data according to some example embodiments.

FIG. 14 is a block diagram illustrating an automatic frequency controller 100b including a wireless channel classifier 150B using machine learning methods according to some example embodiments. Referring to FIG. 14, an automatic frequency controller (AFC) 100b may include a phase estimator 130', an absolute value calculator 135', the wireless channel classifier 150B, a loop gain controller 160 and a digital loop filter 170. In some embodiments, the AFC 100b corresponds to the AFC 100 of FIG. 5, and a redundant description will be omitted. In some example embodiments, the AFC 100b may further include the channel estimator 110 and the differential correlator 120 of FIG. 5. In some example embodiments, the AFC 100b may further include the phase limiter 140 and/or the frequency offset compensator 180 of FIG. 5, but is not limited thereto. Any or all of the components of the AFC 100b (e.g., the phase estimator 130', the absolute value calculator 135', the wireless channel classifier 150B, the loop gain controller 160, the digital loop filter 170, the channel estimator 110, the differential correlator 120, the phase limiter 140, and the frequency offset compensator 180) may be a hardware block including an analog circuit and/or a digital circuit, and may be a software block including a plurality of instructions that are executed by a processor or the like. Operations described herein as being performed by any or all of the phase estimator 130', the absolute value calculator 135', the wireless channel classifier 150B, the loop gain controller 160, the digital loop filter 170, the channel estimator 110, the differential correlator 120, the phase limiter 140, and the frequency offset compensator 180 may be performed by at least one processor executing program code that includes instructions stored in a memory corresponding to the operations.

The phase estimator 130' may output a phase estimate PE and a phase estimate difference PED. In this case, the phase estimate PE is an estimate of a phase difference at different time indexes in the same slot, and the phase estimate PE in an i-th slot may be expressed by $\hat{\phi}[i]$. The phase estimate difference PED is the amount of variation in phase estimates of different slots, and the phase estimate difference PED in the i-th slot may be expressed by $\hat{\phi}[i]-\hat{\phi}[i-1]$. The absolute value calculator 135' may calculate the absolute value |PE| of the phase estimate PE and the absolute value |PED| of the phase estimate difference PED.

The wireless channel classifier 150B may classify the downlink channel 2 as an HST channel or a non-HST channel by using training data. According to some example embodiments, the wireless channel classifier 150B may use supervised learning methods for making a model related to a Doppler shift and observed phase estimates. In some example embodiments, the wireless channel classifier 150B may include a Support Vector Machine (SVM) classifier 156 and an SVM derivation unit 157. An SVM is a kind of supervised learning algorithm that improves a classification margin for training data by using the training data. Any or all of the components of the wireless channel classifier 150B (e.g., the SVM classifier 156 and the SVM derivation unit 157) may be a hardware block including an analog circuit and/or a digital circuit, and may be a software block including a plurality of instructions that are executed by a processor or the like. Operations described herein as being performed by any or all of the SVM classifier 156 and the SVM derivation unit 157 may be performed by at least one processor executing program code that includes instructions stored in a memory corresponding to the operations. Hereinafter, the wireless channel classifier 150B will be described in more detail with reference to FIG. 15.

Figure 15:
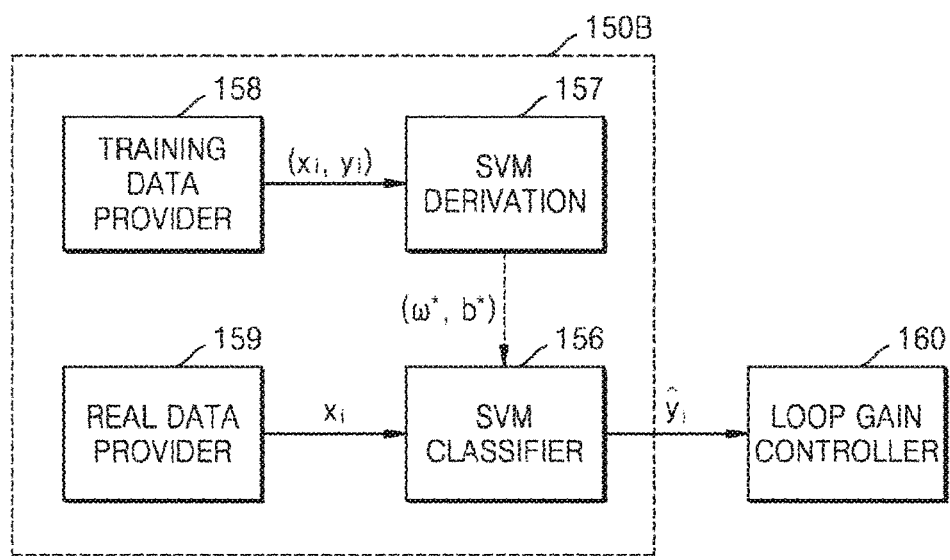
FIG. 15 is a block diagram illustrating the wireless channel classifier of FIG. 14 in more detail, according to some example embodiments.

FIG. 15 is a block diagram illustrating the wireless channel classifier 150B of FIG. 14 in more detail, according to some example embodiments. Referring to FIG. 15, the wireless channel classifier 150B may include an SVM classifier 156 and an SVM derivation unit 157. In addition, the wireless channel classifier 150B may further include a training data provider 158 and a real data provider 159, but some example embodiments are not limited thereto. Any or all of the components of the wireless channel classifier 150B (e.g., the SVM classifier 156, the SVM derivation unit 157, the training data provider 158, and the real data provider 159) may be a hardware block including an analog circuit and/or a digital circuit, and may be a software block including a plurality of instructions that are executed by a processor or the like. Operations described herein as being performed by any or all of the SVM classifier 156, the SVM derivation unit 157, the training data provider 158, and the real data provider 159 may be performed by at least one processor executing program code that includes instructions stored in a memory corresponding to the operations.

The training data provider 158 may provide the SVM derivation unit 157 with training data collected when a channel environment is known in advance. Training data classified by a label, that is, labeled training data, may be obtained from an output of a wireless channel emulator that repeatedly generates an emulated signal. It may be assumed that the training data provider 158 provides N training data as shown in Equation 15.

$$(x_i, y_i)_{i=1}^{N} \qquad \text{[Equation 15]}$$

Here, $x_i$ denotes an input vector and $y_i$ denotes a label. In some example embodiments, as a two-dimensional input space, the absolute value of a phase estimate and the absolute value of a phase estimate difference (e.g., a variation in the phase estimate) may be selected. In this case, a phase error may correspond to an output of a digital loop filter, and specifically, the phase error may correspond to an estimate of a phase difference obtained in the same slot. The amount of variation in the phase error may correspond to the amount of variation in phase errors of different slots output from a digital loop filter. Accordingly, an input vector may be selected as a two-dimensional vector as shown in Equation 16 below.

$$x_i \triangleq (\hat{\phi}[i], \hat{\phi}[i] - \hat{\phi}[i-1]) \qquad \text{[Equation 16]}$$

$y_i$ indicates whether training data corresponds to an HST channel, and may be represented as shown in Equation 17 below.

$$y_i = \begin{cases} -1, & \text{if } x_i \text{ is } HST, \\ 1, & \text{otherwise.} \end{cases} \qquad \text{[Equation 17]}$$

The SVM derivation unit 157 may obtain a separating hyperplane having a soft margin from the training data. Specifically, the SVM derivation unit 157 may obtain an effective separating hyperplane, e.g., (w*,b*) by using Equation 18 below.

$$\underset{w, b, \xi_i}{\text{minimize}} \frac{1}{2} \|w\|^2 + C \sum_{i=1}^{N} \xi_i \qquad \text{[Equation 18]}$$

$$\text{subject to } y_i(w^T x_i + b) \geq 1 - \xi_i, \forall i \; \xi_i \geq 0, \forall i$$

Here, w and b denote parameters for determining the separating hyperplane, and denotes a regularization parameter for determining classification performance. As decreases, a margin may increase. On the other hand, as C increases, the margin may decrease. N is the total number of training data, i is an index of the training data, and $\xi_i$ is a slack variable indicating the amount of classification error that is acceptable for i-th training data. In the case of a hard margin, $\xi_i$ is zero, while in the case of a soft margin, $\xi_i$ may be zero or more. Since Equation 18 is related to a convex problem, an effective solution, e.g., (w*,b*), may be obtained by using numerical techniques such as inter-point methods, for example, by using a Karush-Kuhn-Tucker (KKT) condition.

Figure 16:
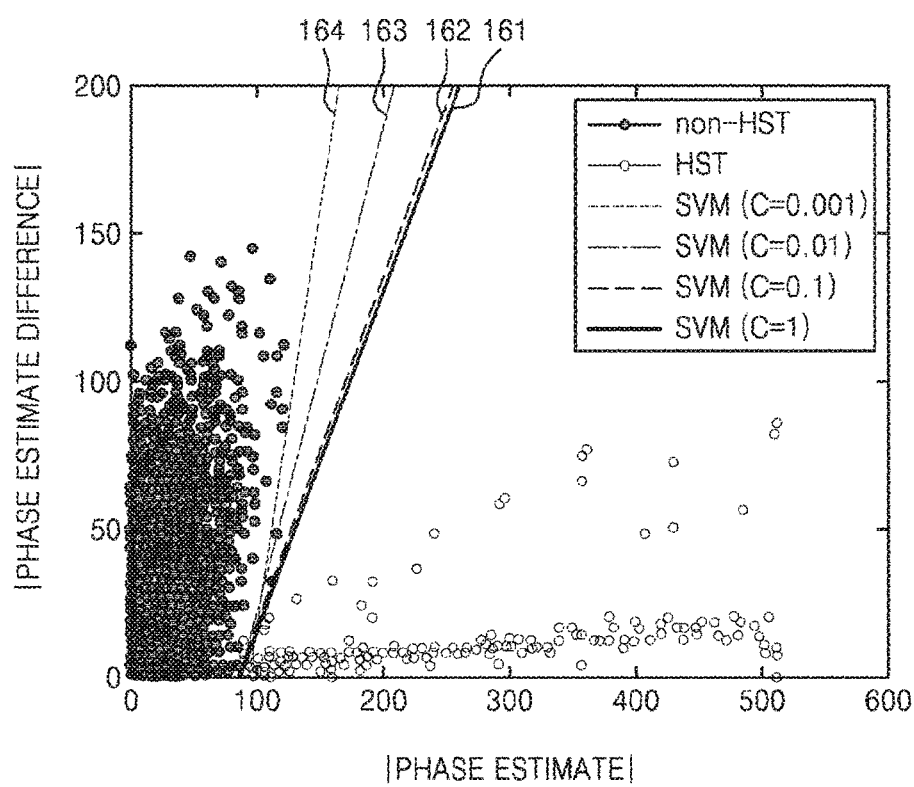
FIG. 16 illustrates a Support Vector Machine (SVM) classifier obtained from training data, according to some example embodiments.

FIG. 16 illustrates an SVM classifier obtained from training data, according to some example embodiments. Hereinafter, the description of the SVM classifier will be made with reference to FIG. 15 and FIG. 16.

Referring to FIG. 16, the horizontal axis represents the absolute value of a phase estimate, and the vertical axis represents the absolute value of a phase estimate difference. Training data acquired in a non-HST channel environment is mainly distributed in an interval where the absolute value of the phase estimate is less than 100 degrees, and training data acquired in an HST channel environment is mainly distributed in an interval where the absolute value of the phase estimate is 100 degrees or more. The SVM derivation unit 157 may obtain first to fourth separating hyperplanes 161 to 164 from training data by using Equation 18. The first separating hyperplane 161 corresponds to the case where C is 1, the second separating hyperplane 162 corresponds to the case where C is 0.1, the third separating hyperplane 163 corresponds to the case where C is 0.01, and the fourth separating hyperplane 164 corresponds to the case where C is 0.001.

According to some example embodiments, a separating hyperplane may be obtained based on training data having a two-dimensional input space, e.g., the absolute value of a phase estimate and the absolute value of a phase estimate difference, and it may be determined whether real data having a two-dimensional input space corresponds to an HST channel, by using the separating hyperplane. Accordingly, classification performance may be improved as compared with the case where it is determined whether real data corresponds to the HST channel based on only a one-dimensional input space, e.g., the absolute value of a phase estimate.

Referring back to FIG. 15, the real data provider 159 may provide the SVM classifier 156 with a two-dimensional input vector including the absolute value of a phase estimate and the absolute value of a phase estimate difference. The absolute value of the phase estimate and the absolute value of the phase estimate difference may be obtained from the absolute value calculator 135' of FIG. 14.

The SVM classifier 156 may generate a classifier for determining whether real data corresponds to the HST channel by using the effective separating hyperplane, e.g., (w*,b*), derived from the SVM derivation unit 157. Specifically, the SVM classifier 156 may generate a classifier as shown in Equation 19 below.

$$\hat{y}_i \triangleq sgn(w^{*T} x_i + b^*) \qquad \text{[Equation 19]}$$

Here, $x_i$ denotes an input of the SVM classifier 156, and $\hat{y}_i$ denotes an output of the SVM classifier 156. According to Equation 19, is $-1$ when $w^{*T}x_i + b^*$ is less than 0, and in this case, the SVM classifier 156 may determine that real data corresponds to an HST channel. On the other hand, according to Equation 19, $\hat{y}_i$ is 1 when $w^{*T}x_i + b^*$ is greater than 0, and in this case, the SVM classifier 156 may determine that real data corresponds to a non-HST channel. According to Equation 19, $\hat{y}_i$ is 0 when $w^{*T}x_i + b^*$ is 0, and in this case, the SVM classifier 156 may determine that real data is located on a separating hyperplane.

The loop gain controller 160 may adjust a loop gain when the output of the SVM classifier 156 is less than 0. In some example embodiments, the loop gain controller 160 may reduce a loop gain index K[n] by one from a previous loop gain index K[n−1] when $w^{*T}x_i + b^*$ is less than 0. On the other hand, when $w^{*T}x_i + b^*$ is equal to or greater than 0, the loop gain controller 160 may increase the loop gain index K[n] by one from the previous loop gain index K[n−1]. In addition, the loop gain controller 160 may determine a loop gain as a lower limit loop gain when the loop gain is less than low loop gain threshold, and may determine a loop gain as an upper limit loop gain when the loop gain is greater than a high loop gain threshold. In some example embodiments, the lower limit loop gain may be equal to the low loop gain threshold. In some example embodiments, the upper limit loop gain may be equal to the high loop gain threshold.

Figure 17:
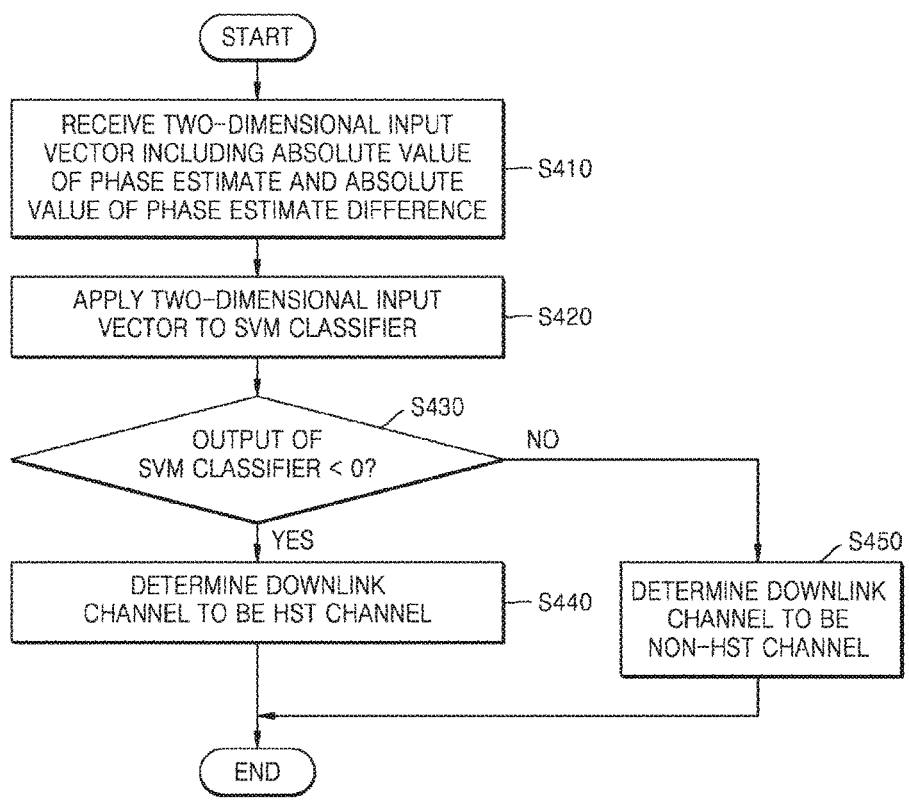
FIG. 17 is a flowchart illustrating wireless channel classification methods using an SVM classifier according to some example embodiments.

FIG. 17 is a flowchart illustrating wireless channel classification methods using an SVM classifier according to some example embodiments. Referring to FIG. 17, the wireless channel classification methods according to some example embodiments are methods of classifying a wireless channel based on training data obtained in an HST channel environment and a non-HST channel environment. For example, the wireless channel classification methods may include operations that are performed in a time-series manner in the wireless channel classifier 150B. Therefore, the description provided above with reference to FIGS. 14 to 16 may be applied to some example embodiments, and a redundant description will be omitted.

In Operation S410, a two-dimensional input vector that includes the absolute value of a phase estimate and the absolute value of a phase estimate difference is received. In Operation S420, the two-dimensional input vector is applied to an SVM classifier. In Operation S430, it is determined whether the output of the SVM classifier is less than 0. If it is determined that the output of the SVM classifier is less than 0, Operation S440 is performed. In Operation S440, a downlink channel is determined to be an HST channel. On the other hand, if it is determined that the output of the SVM classifier is not less than 0, Operation S450 is performed. In Operation S450, the downlink channel is determined to be a non-HST channel.

Figure 18A:
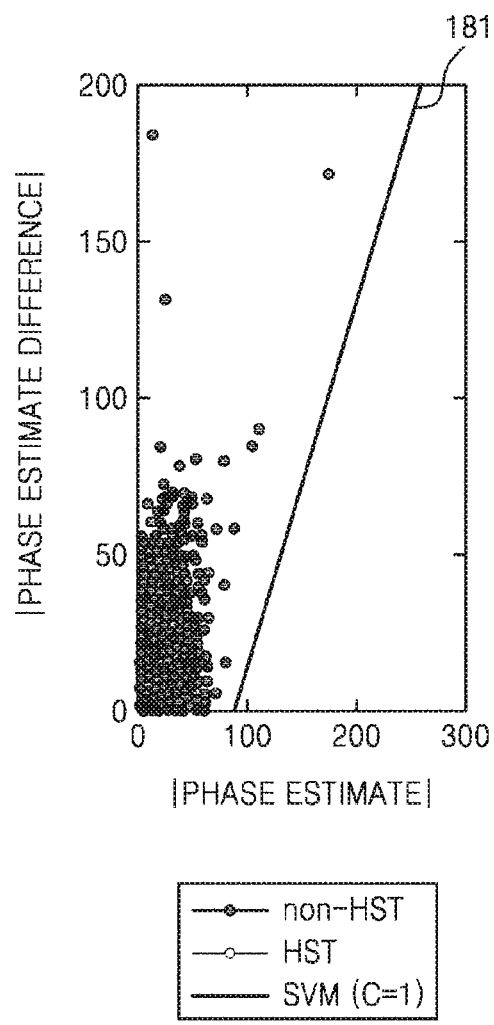
FIG. 18A shows the distribution of data measured when train speed is 100 km/h or less in an actual HST environment, according to some example embodiments.
Figure 18B:
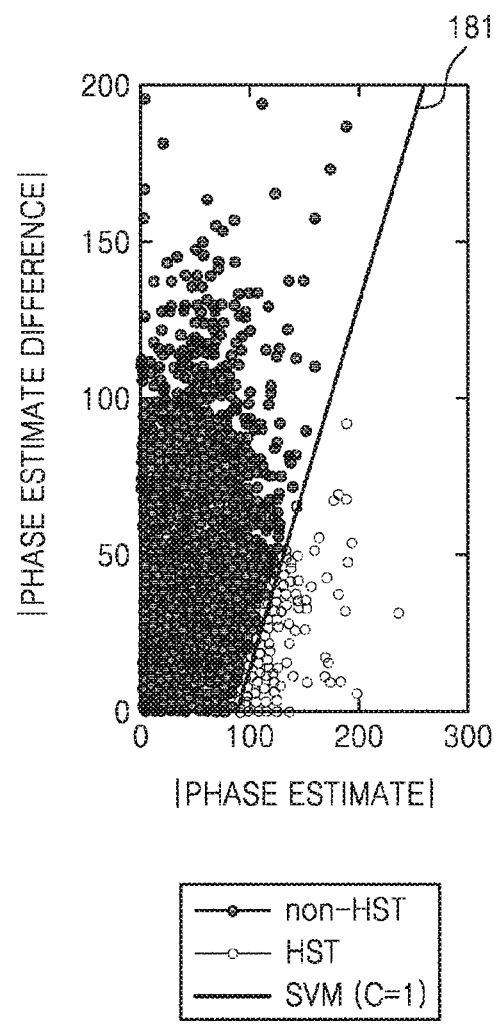
FIG. 18B shows the distribution of data measured when train speed is 280 km/h or more in an actual HST environment, according to some example embodiments.

FIGS. 18A and 18B show data distributions measured in an actual HST environment, according to some example embodiments. Referring to FIGS. 18A and 18B, the horizontal axis represents the absolute value of a phase estimate, and the vertical axis represents the absolute value of a phase estimate difference. Here, a separating hyperplane 181 may be obtained, for example, through some example embodiments described above with reference to FIGS. 14 to 16.

FIG. 18A shows the distribution of data measured when train speed is, for example, 100 km/h or less in an actual HST environment. In FIG. 18A, the measured data are all classified as data of a non-HST channel, in which case reception performance may be improved by applying a fixed loop gain to reduce jitter, according to some example embodiments. For example, the fixed loop gain may be generated by setting a loop gain index K to 6.

FIG. 18B shows the distribution of data measured when the train speed is, for example, 280 km/h or more in an actual HST environment. In FIG. 18B, some of the measured data are classified as data of an HST channel. In this way, the number of data classified as data of the HST channel increases in an HST environment in which train speed is high. In this case, reception performance may be improved by applying a variable loop gain to quickly track a change in Doppler shift, according to some example embodiments. For example, the variable loop gain may be generated by determining the loop gain index K to be less than 6.

Figure 19:
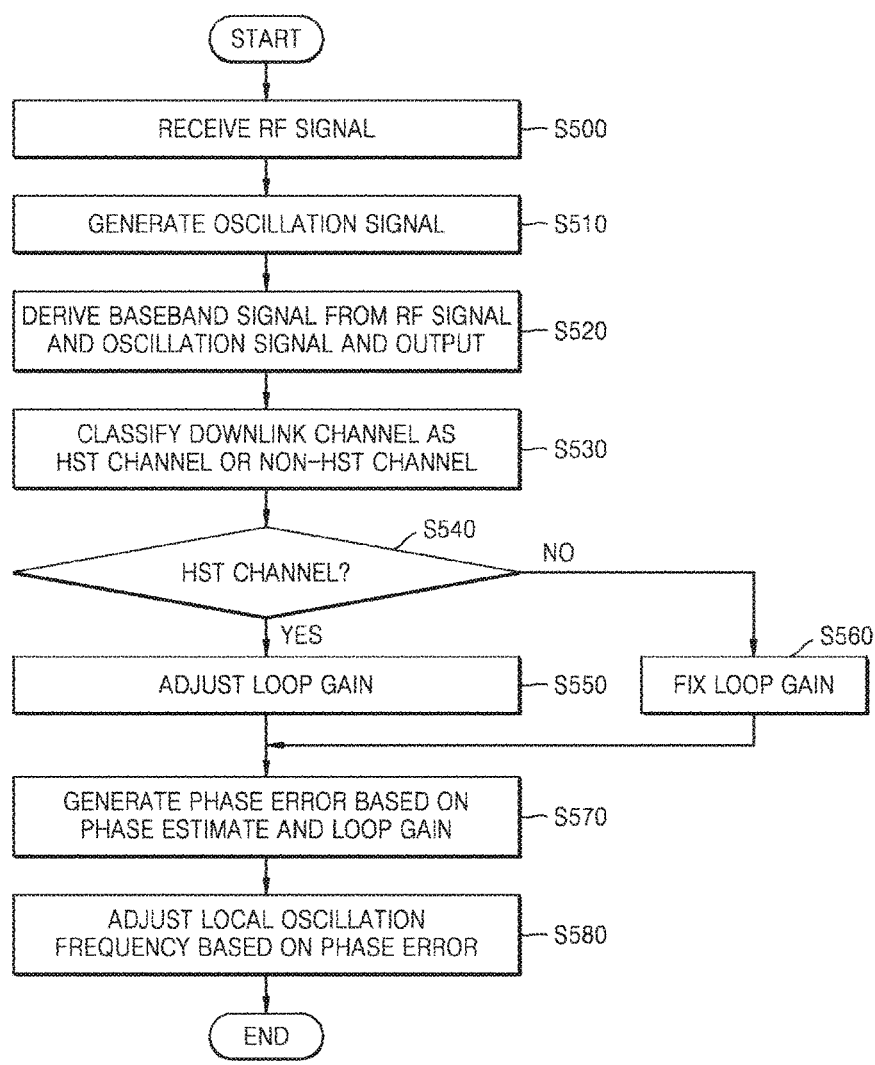
FIG. 19 is a flowchart illustrating wireless communication methods for correcting a carrier frequency offset according to some example embodiments.

FIG. 19 is a flowchart illustrating wireless communication methods according to some example embodiments. Referring to FIG. 19, the wireless communication methods according to some example embodiments are methods for correcting a carrier frequency offset in a user equipment. For example, the wireless communication methods may include operations that are performed in a time-series manner in the terminal 10 of FIG. 1. The description provided above with reference to FIGS. 1 to 18B may also be applied to some example embodiments, and a redundant description will be omitted.

In Operation S500, an RF signal is received from a base station. In Operation S510, an oscillation signal having a local oscillation frequency is generated. In Operation S520, a baseband signal is derived from the RF signal and the oscillation signal and output. In Operation S530, a downlink channel is classified as an HST channel or a non-HST channel. In Operation S540, it is determined whether the downlink channel is an HST channel. If it is determined that the downlink channel is an HST channel, Operation S550 is performed. Otherwise, Operation S560 is performed. In Operation S550, a loop gain is adjusted. In Operation S560, the loop gain is fixed. In Operation S570, a phase error is generated based on a phase estimate and the loop gain. In Operation S580, the local oscillation frequency is corrected according to the phase error. In some example embodiments, a terminal may communicate with the base station using the corrected local oscillation frequency.

Figure 20A:
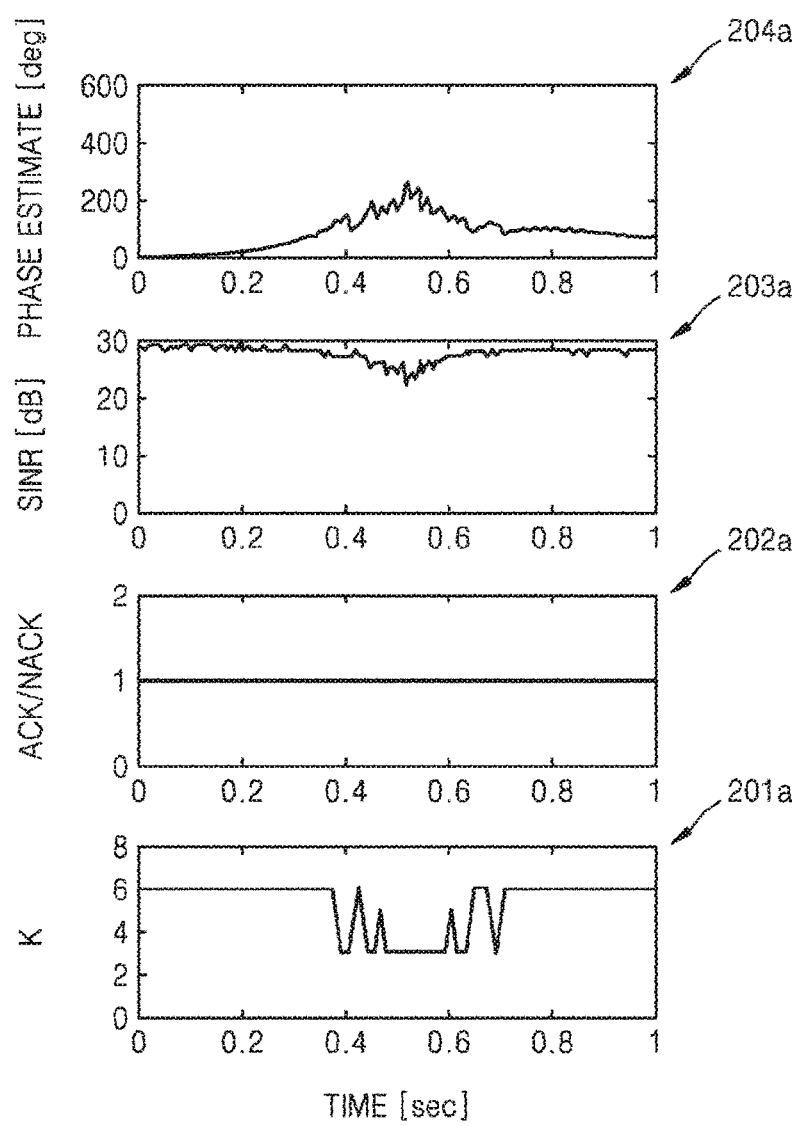
FIG. 20A illustrates reception performance when a variable loop gain is applied to a digital loop filter in an HST channel, according to some example embodiments.
Figure 20B:
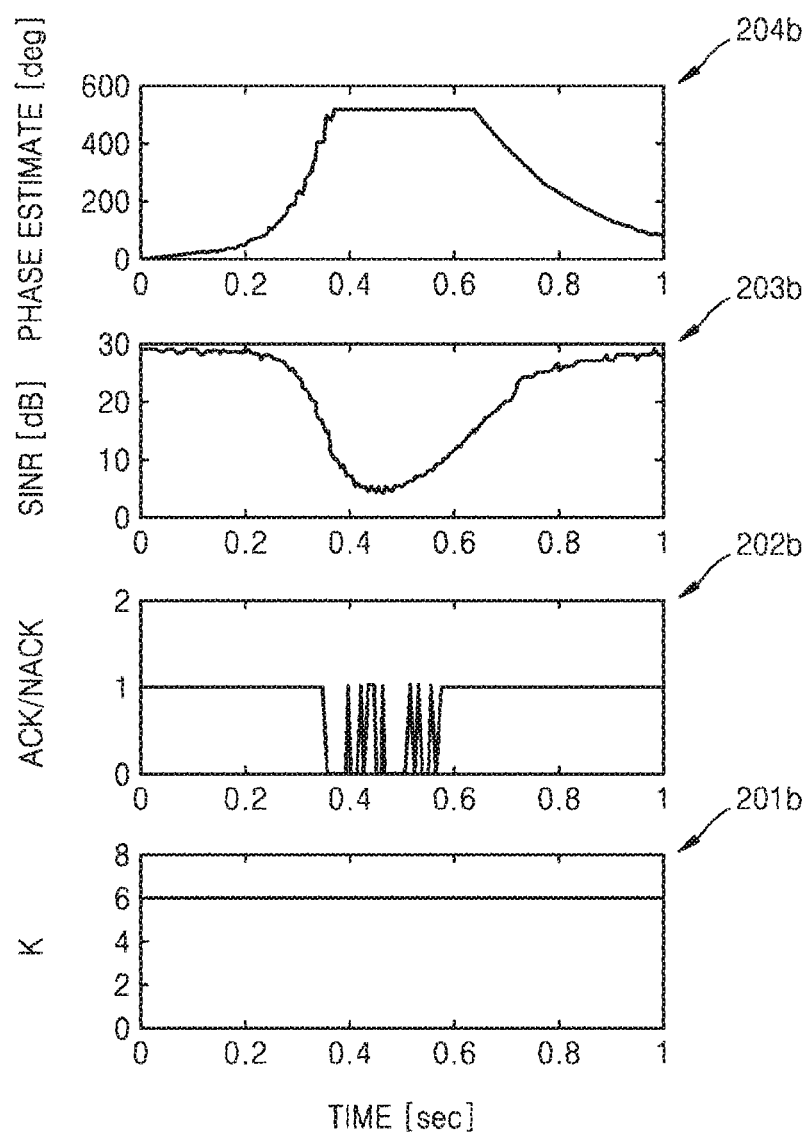
FIG. 20B illustrates reception performance when a fixed loop gain is applied to a digital loop filter in an HST channel, according to some example embodiments.

FIG. 20A illustrates reception performance when a variable loop gain is applied to a digital loop filter in an HST channel, according to some example embodiments, and FIG. 20B illustrates reception performance when a fixed loop gain is applied to a digital loop filter in an HST channel, according to some example embodiments.

Referring to FIG. 20A, when a loop gain in the HST channel is determined as the variable loop gain, a loop gain index K may be changed according to time, as shown in a graph 201a. For example, the loop gain index K may be changed in a time period of about 0.4 to 0.7 seconds. A graph 202a indicates whether transmission is successful over time. In the graph 202a, a case where an ACK signal is generated is denoted by 1, and a case where a NACK signal is generated is denoted by 0. In the graph 202a, the ACK signal is continuously generated and this case indicates that data has been normally transmitted from a base station. A graph 203a represents an SINR over time, and a decrease in the SINR may not be relatively large while the loop gain index K is variable. A graph 204a represents a phase estimate over time, and an increase in the phase estimate may not be relatively large while the loop gain index K is variable.

Referring to FIG. 20B, when a loop gain in the HST channel is determined as the fixed loop gain, a loop gain index K may not be changed according to time, as shown in a graph 201b. For example, the loop gain index K may be 6. In a graph 202b, an ACK signal is interrupted during a time period of about 0.3 to 0.6 seconds and this case indicates that data has not been normally transmitted from the base station. In a graph 203b, an SINR may decrease in a time period of about 0.3 to 0.7 seconds. In a graph 204b, an increase in the phase estimate may be large in the time period of about 0.3 to 0.7 seconds. As illustrated in FIGS. 20A and 20B, when a variable loop gain is applied to a digital loop filter in place of a fixed loop gain in an HST channel, reception performance is further improved.

While some example embodiments have been particularly shown and described, it will be understood that various changes in form and details may be made therein without departing from the spirit and scope of the following claims.

What is claimed is:

1. An automatic frequency controller of a terminal for correcting a frequency offset between a base station and the terminal, the automatic frequency controller comprising:

a memory having computer-readable instructions stored thereon; and at least one processor communicatively coupled to the memory and configured to execute the computer-readable instructions to obtain a phase estimate from a reference signal received from the base station;

classify a downlink channel as a high speed train (HST) channel or a non-HST channel based on the phase estimate;

determine a loop gain as a variable loop gain when the downlink channel is classified as the HST channel;

determine the loop gain as a fixed loop gain when the downlink channel is classified as the non-HST channel;

adjust the loop gain based on determining the loop gain as the variable loop gain;

calculate a phase error based on the phase estimate and one of the adjusted loop gain or the fixed loop gain;

correct the frequency offset using the phase error; and communicate with the base station after correcting the frequency offset.

2. The automatic frequency controller of claim 1, wherein the at least one processor is further configured to:

classify the downlink channel as the HST channel or the non-HST channel, based on statistical characteristics of phase estimates in the HST channel and the non-HST channel.

3. The automatic frequency controller of claim 2, wherein the at least one processor is further configured to:

calculate a moving mean of an absolute value of the phase estimate; and calculate a moving variance of the absolute value of the phase estimate using data corresponding to the moving mean.

4. The automatic frequency controller of claim 3, wherein the at least one processor is further configured to:

calculate an exponentially weighted moving mean of the absolute value of the phase estimate; and calculate an exponentially weighted moving variance of the absolute value of the phase estimate.

5. The automatic frequency controller of claim 3, wherein the at least one processor is further configured to:

filter the moving variance; and limit the filtered moving variance to an upper limit variance value.

6. The automatic frequency controller of claim 5, wherein the at least one processor is further configured to:

adjust the loop gain when a value of the filtered moving variance is greater than a threshold value.

7. The automatic frequency controller of claim 6, wherein the at least one processor is further configured to:

set the loop gain as a lower limit loop gain when the loop gain is less than a low loop gain threshold; and set the loop gain as an upper limit loop gain when the loop gain is greater than a high loop gain threshold.

8. The automatic frequency controller of claim 1, wherein the at least one processor is further configured to:

classify the downlink channel as the HST channel or the non-HST channel, based on training data obtained in an HST channel environment and a non-HST channel environment.

9. The automatic frequency controller of claim 8, wherein the at least one processor is further configured to:

receive a two-dimensional input vector including an absolute value of the phase estimate and an absolute value of a phase estimate difference; and classify the downlink channel as the HST channel or the non-HST channel, based on a classifier obtained based on the training data, using the two-dimensional input vector.

10. The automatic frequency controller of claim 9, wherein the classifier is a Support Vector Machine (SVM) classifier having a soft margin with respect to the training data.

11. The automatic frequency controller of claim 10, wherein the at least one processor is further configured to:

adjust the loop gain when the SVM classifier outputs a value less than 0.

12. The automatic frequency controller of claim 11, wherein the at least one processor is further configured to:

set the loop gain as a lower limit loop gain when the loop gain is less than a low loop gain threshold; and set the loop gain as an upper limit loop gain when the loop gain is greater than a high loop gain threshold.

13. The automatic frequency controller of claim 1, wherein the at least one processor is further configured to:

calculate channel estimates by performing channel estimation on at least one reference symbol included in the reference signal;

calculate a differential correlation for the channel estimates; and calculate the phase estimate from the differential correlation.

14. The automatic frequency controller of claim 13, wherein the at least one processor is configured to:

limit the phase estimate to a value less than or equal to an upper limit phase estimate; and calculate the phase error by multiplying the limited phase estimate by the loop gain, the loop gain being the variable loop gain or the fixed loop gain.

15. The automatic frequency controller of claim 1, wherein the at least one processor is further configured to:

estimate the frequency offset according to the phase error; and generate a frequency control signal for controlling a local oscillation frequency according to the frequency offset.

16. An automatic frequency controller of a terminal for correcting a frequency offset between a base station and the terminal, the automatic frequency controller comprising:

a memory having computer-readable instructions stored thereon; and at least one processor communicatively coupled to the memory and configured to execute the computer-readable instructions to classify a downlink channel as a high speed train (HST) channel or a non-HST channel based on a reference signal received from the base station, the reference signal including the frequency offset;

determine a loop gain as a variable loop gain when the downlink channel is classified as the HST channel;

determine the loop gain as a fixed loop gain when the downlink channel is classified as the non-HST channel;

adjust the loop gain based on determining the loop gain as the variable loop gain;

calculate a value corresponding to the frequency offset from the reference signal according to one of the adjusted loop gain or the fixed loop gain;

correct the frequency offset using the value; and communicate with the base station after correcting the frequency offset.

17. A wireless communication device, comprising:
a memory having computer-readable instructions stored thereon; and
at least one processor communicatively coupled to the memory and configured to execute the computer-readable instructions to
receive an input signal having a carrier frequency and including a reference signal from a base station;
generate a first oscillation signal having a first oscillation frequency;
generate a baseband signal using the input signal and the first oscillation signal, the baseband signal including the reference signal;
generate at least one channel estimate based on the reference signal using the baseband signal;
calculate a differential correlation of the at least one channel estimate;
calculate a phase estimate based on the calculated differential correlation;
classify a channel corresponding to the base station as one of a high speed train (HST) channel or a non-HST channel based on the phase estimate;
determine a loop gain based on the classification of the channel;
determine a phase error based on the phase estimate and the loop gain;
estimate a carrier frequency offset using the phase error;
generate a frequency control signal for matching the first oscillation frequency with the carrier frequency;
generate a second oscillation signal having a second oscillation frequency based on the frequency control signal; and
communicate with the base station using the second oscillation signal.

18. The wireless communication device of claim 17, wherein the at least one processor is further configured to:
calculate an absolute value of the phase estimate;
calculate a moving mean for the absolute value of the phase estimate;
calculate a moving variance for the absolute value of the phase estimate using the absolute value of the phase estimate and data corresponding to the moving mean;
compare the moving variance to a threshold value; and
classify the channel based on the comparison.

19. The wireless communication device of claim 17, wherein the at least one processor is further configured to:
calculate a phase estimate difference using the phase estimate;
calculate an absolute value of the phase estimate;
calculate an absolute value of the phase estimate difference;
generate a Support Vector Machine (SVM) classifier using training data obtained in an HST channel environment and a non-HST channel environment; and
classify the channel using the SVM classifier based on the absolute value of the phase estimate and the absolute value of the phase estimate difference.

20. An automatic frequency control method performed by a terminal, comprising:
obtaining a phase estimate from a reference signal received from a base station;
classifying a downlink channel as a high speed train (HST) channel or a non-HST channel based on the phase estimate;
determining a loop gain as a variable loop gain when the downlink channel is classified as the HST channel;
determining the loop gain as a fixed loop gain when the downlink channel is classified as the non-HST channel;
adjusting the loop gain based on determining the loop gain as the variable loop gain;
generating a phase error based on the phase estimate and at least one of the adjusted loop gain or fixed loop gain;
correcting a frequency offset with the base station, according to the phase error; and
communicating with the base station after correcting the frequency offset.

21. A wireless communication device, comprising:
a memory having computer-readable instructions stored thereon; and
at least one processor communicatively coupled to the memory and configured to execute the computer-readable instructions to
generate an oscillation signal having a local oscillation frequency,
generate a baseband signal based on an RF signal received from a base station and the oscillation signal,
classify a downlink channel as a high speed train (HST) channel or a non-HST channel based on a reference signal included in the baseband signal,
determine a loop gain as a variable loop gain when the downlink channel is classified as the HST channel,
determine the loop gain as a fixed loop gain when the downlink channel is classified as the non-HST channel,
adjust the loop gain based on determining the loop gain as the variable loop gain,
calculate a phase error from the reference signal according to one of the adjusted loop gain or the fixed loop gain,
adjust the local oscillation frequency based on the calculated phase error, and
communicate with the base station using the adjusted local oscillation frequency.

22. The wireless communication device of claim 21, wherein the at least one processor is further configured to:
obtain a phase estimate from the reference signal;
classify the downlink channel as the HST channel or the non-HST channel based on the phase estimate; and
calculate the phase error based on the phase estimate and one of the adjusted loop gain or the fixed loop gain.

23. The wireless communication device of claim 22, wherein the at least one processor is further configured to:
calculate a moving mean an absolute value of the phase estimate;
calculate a moving variance of an absolute value of the phase estimate using data corresponding to the moving mean; and
classify the downlink channel as the HST channel or the non-HST channel based on the moving variance.

24. The wireless communication device of claim 22, wherein the at least one processor is further configured to:
classify the downlink channel as the HST channel or the non-HST channel by applying a two-dimensional input vector to a Support Vector Machine (SVM) classifier obtained through training data, the two-dimensional input vector including an absolute value of the phase estimate and an absolute value of a phase estimate difference.

25. A wireless communication method performed by a terminal, comprising:
receiving a radio frequency (RF) signal from a base station;

generating an oscillation signal having a local oscillation frequency;

generating a baseband signal based on the RF signal and the oscillation signal;

classifying a downlink channel as a high speed train (HST) channel or a non-HST channel based on a reference signal included in the baseband signal;

determining a loop gain as a variable loop gain when the downlink channel is classified as the HST channel;

determining the loop gain as a fixed loop gain when the downlink channel is classified as the non-HST channel;

adjusting the loop gain based on determining the loop gain as the variable loop gain;

generating a phase error from the reference signal based on one of the adjusted loop gain and the fixed loop gain;

adjusting the local oscillation frequency based on the phase error; and communicating with the base station using the adjusted local oscillation frequency.

26. The wireless communication method of claim 25, further comprising:

obtaining a phase estimate from the reference signal; and wherein the classifying further includes calculating a moving mean of an absolute value of the phase estimate, calculating a moving variance of the absolute value of the phase estimate using data corresponding to the moving mean, and classifying the downlink channel as the HST channel or the non-HST channel based on the moving variance.

27. The wireless communication method of claim 25, further comprising:

obtaining a phase estimate and a phase estimate difference from the reference signal; and wherein the classifying further includes receiving a two-dimensional input vector including an absolute value of the phase estimate and an absolute value of the phase estimate difference, and classifying the downlink channel as the HST channel or the non-HST channel by applying the two-dimensional input vector to a Support Vector Machine (SVM) classifier obtained from training data.

* * * * *